(12) United States Patent
Pedersen et al.

(10) Patent No.: US 7,714,235 B1
(45) Date of Patent: May 11, 2010

(54) LITHOGRAPHICALLY DEFINED MICROELECTRONIC CONTACT STRUCTURES

(75) Inventors: David V. Pedersen, Scotts Valley, CA (US); Igor Y. Khandros, Orinda, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/539,287

(22) Filed: Mar. 30, 2000

Related U.S. Application Data

(63) Continuation-in-part of application No. 08/852,152, filed on May 6, 1997, now Pat. No. 6,184,053.

(51) Int. Cl.
*H01R 12/04* (2006.01)
*H05K 1/11* (2006.01)

(52) U.S. Cl. ......................... 174/267; 439/77
(58) Field of Classification Search ................. 174/260, 174/262, 251, 254, 256, 267; 361/749, 776; 439/67, 77
See application file for complete search history.

(56) References Cited

U.S. PATENT DOCUMENTS

| | | | |
|---|---|---|---|
| 3,383,564 A * | 5/1968 | Lalmond et al. ............. 174/254 |
| 3,846,166 A * | 11/1974 | Saiki et al. ..................... 427/99 |
| 4,027,935 A | 6/1977 | Byrnes et al. | |
| 4,436,766 A * | 3/1984 | Williams ..................... 427/96 |
| 4,615,573 A | 10/1986 | White et al. | |
| 5,070,297 A | 12/1991 | Kwon et al. | |
| 5,172,050 A | 12/1992 | Swapp | |
| 5,177,438 A | 1/1993 | Littlebury et al. | |
| 5,191,708 A | 3/1993 | Kasukabe et al. | |
| 5,354,712 A | 10/1994 | Ho et al. | |
| 5,391,521 A | 2/1995 | Kim | |
| 5,416,278 A * | 5/1995 | Ostrem et al. ............... 174/263 |
| 5,436,411 A * | 7/1995 | Pasch .......................... 174/261 |

(Continued)

FOREIGN PATENT DOCUMENTS

CH         661129 A5       6/1987

(Continued)

OTHER PUBLICATIONS

Abolafia, "Tapered Vias in a Photosensitive Dielectric Film," IBM Technical Disclosure Bulletin, vol. 21 No. 12 (May 1979), p. 4787.

(Continued)

*Primary Examiner*—Jeremy C Norris
(74) *Attorney, Agent, or Firm*—N. Kenneth Burraston

(57) ABSTRACT

Microelectronic contact structures (260, 360, 460) are lithographically defined and fabricated by applying a masking layer (220, 320, 420) on a surface of a substrate (202, 302, 402) such as an electronic component, creating an opening (222, 322, 422) in the masking layer, depositing a conductive trace of a seed layer (250, 350, 450) onto the masking layer and into the openings, and building up a mass of conductive material on the conductive trace. The sidewalls of the opening can be sloped (tapered). The conductive trace can be patterned by depositing material through a stencil or shadow mask (240, 340, 440). A protruding feature (230, 430) may be disposed on the masking layer so that a tip end (264, 364, 464) of the contact structure acquires a topography. All of these elements can be constructed as a group to form a plurality of precisely positioned resilient contact structures.

16 Claims, 14 Drawing Sheets

U.S. PATENT DOCUMENTS

| | | | | |
|---|---|---|---|---|
| 5,455,390 | A | * | 10/1995 | DiStefano et al. .......... 174/262 |
| 5,461,775 | A | * | 10/1995 | Tanabe et al. ................ 29/840 |
| 5,465,611 | A | | 11/1995 | Ruf et al. |
| 5,476,211 | A | | 12/1995 | Khandros |
| 5,476,818 | A | | 12/1995 | Yanof et al. |
| 5,477,611 | A | * | 12/1995 | Sweis et al. ................... 29/840 |
| 5,495,667 | A | | 3/1996 | Farnworth et al. |
| 5,513,430 | A | | 5/1996 | Yanof et al. |
| 5,666,190 | A | | 9/1997 | Quate et al. |
| 5,828,226 | A | | 10/1998 | Higgins et al. |
| 5,897,326 | A | * | 4/1999 | Eldridge et al. .............. 438/14 |
| 5,914,614 | A | | 6/1999 | Beaman |
| 5,994,152 | A | | 11/1999 | Khandros et al. |
| 6,014,032 | A | | 1/2000 | Maddix et al. |
| 6,059,982 | A | | 5/2000 | Palagonia et al. |
| 6,064,213 | A | | 5/2000 | Khandros et al. |
| 6,184,053 | B1 | * | 2/2001 | Eldridge et al. .............. 438/52 |
| 6,475,822 | B2 | | 11/2002 | Eldridge et al. |
| 6,482,013 | B2 | | 11/2002 | Eldridge et al. |
| 6,520,778 | B1 | | 2/2003 | Eldridge et al. |
| 6,727,580 | B1 | | 4/2004 | Eldridge et al. |
| 6,807,734 | B2 | | 10/2004 | Eldridge et al. |
| 7,073,254 | B2 | | 7/2006 | Eldridge et al. |
| 2002/0019152 | A1 | | 2/2002 | Eldridge et al. |
| 2003/0199179 | A1 | | 10/2003 | Dozier, II et al. |
| 2004/0072452 | A1 | | 4/2004 | Eldridge et al. |
| 2004/0198081 | A1 | | 10/2004 | Eldridge et al. |
| 2006/0237856 | A1 | | 10/2006 | Eldridge et al. |

FOREIGN PATENT DOCUMENTS

| | | |
|---|---|---|
| EP | 802419 | 4/1997 |
| JP | 52-155388 | 12/1977 |
| JP | 63-012156 | 1/1988 |
| JP | 63-062342 | 3/1988 |
| JP | 63-062343 | 3/1988 |
| JP | 63-177434 | 7/1988 |
| JP | 01-150861 | 6/1989 |
| JP | 01-150862 | 6/1989 |
| JP | 01-260890 | 10/1989 |
| JP | 03-088352 | 4/1991 |
| JP | 05-326357 | 12/1993 |
| JP | 62-98294 | 10/1994 |
| JP | 7-021968 | 1/1995 |
| JP | 07-211373 | 8/1995 |
| JP | 07-240361 | 9/1995 |
| JP | A 7-333232 | 12/1995 |
| JP | A 8-276597 | 10/1996 |
| JP | 08-287983 | 11/1996 |
| JP | A 9-27521 | 1/1997 |
| JP | 10-189168 | 7/1998 |
| WO | WO 95/14314 | 5/1995 |
| WO | WO 95/34106 | 12/1995 |
| WO | WO 96/02068 | 1/1996 |
| WO | WO 96/15459 | 5/1996 |
| WO | WO 97/43653 | 11/1997 |

OTHER PUBLICATIONS

"Robust Method Using Simple Unit Processes for Thin Film Cu-Polyimide Packaging Structures," IBM Technical Disclosure Bulletin, vol. 34 No. 10A (Mar. 1992), pp. 368-369.

Kong et al., "Integrated Electrostically Resonant Scan Tip for an Attomic Force Microscope," Journal of Vacuum Science & Technology, vol. 11 No. 3 (May/Jun. 1993), pp. 634-641.

"Thin Film Substrate for Wire Bonding," IBM Technical Disclosure Bulletin, vol. 32 No. 10A (Mar. 1990), pp. 80-81.

U.S. Appl. No. 08/819,464, filed Mar. 17, 1997, Dozier, II et al.

U.S. Appl. No. 09/032,473, filed Feb. 26, 1998, Pedersen et al.

Brief in Support of Cancellation Action Against FormFactor's TW Patent No. NI-121535 (Jan. 28, 2005).

Leung et al., "Active Substrate Membrane Probe Card," Center for Integrated Systems (Stanford University) (Oct. 12, 1995).

* cited by examiner

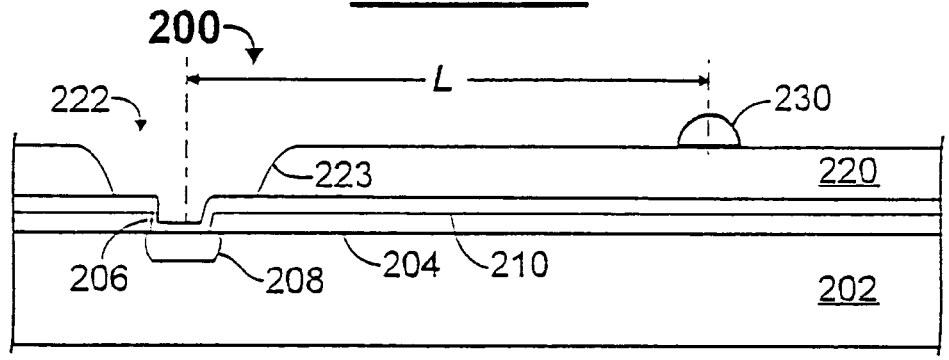
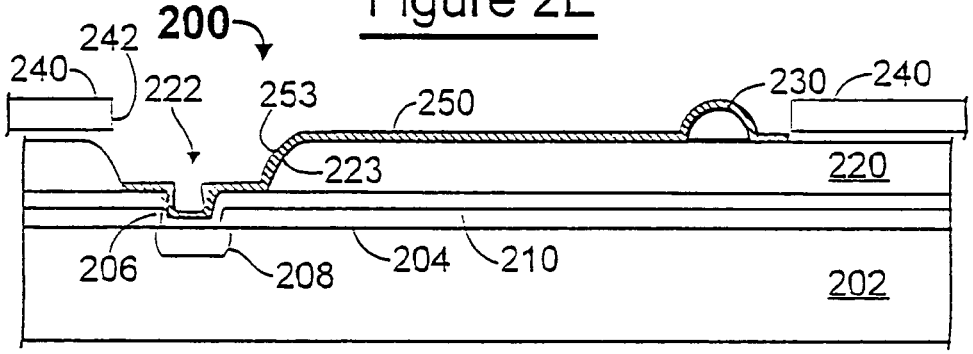
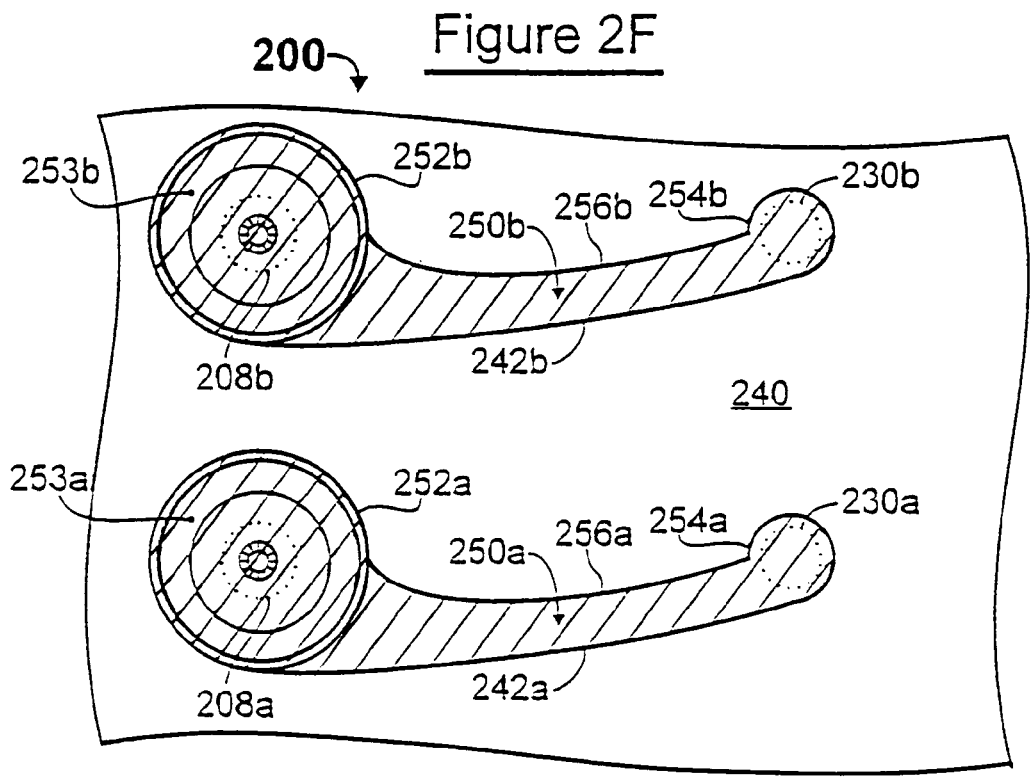

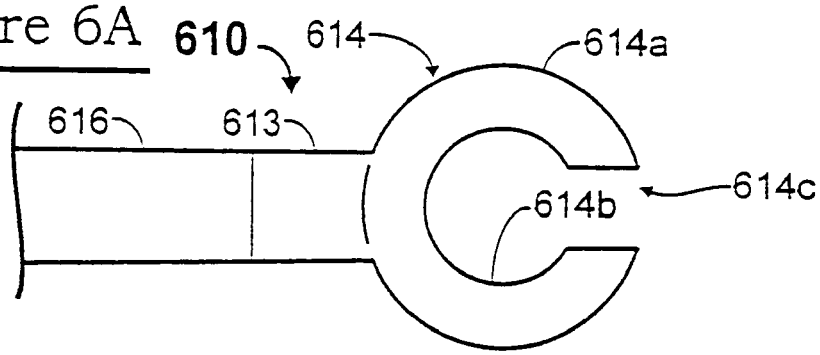
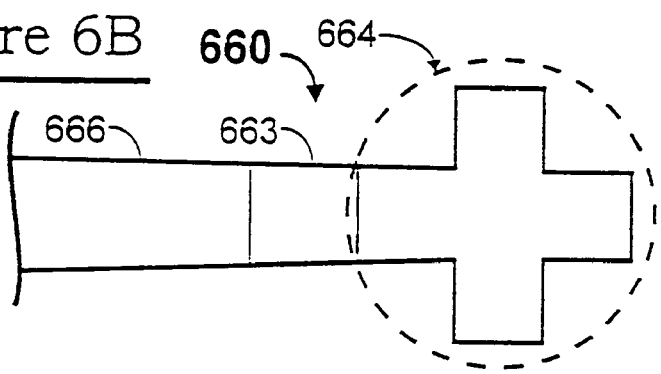
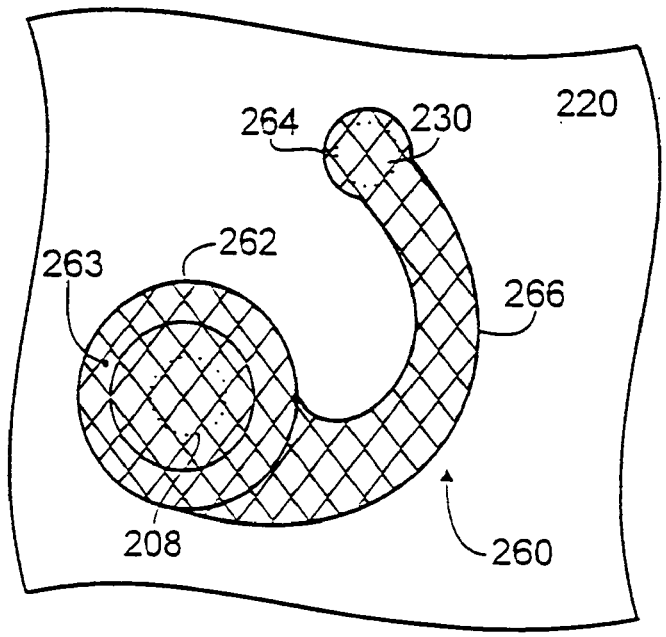

LITHOGRAPHICALLY DEFINED MICROELECTRONIC CONTACT STRUCTURES

CROSS-REFERENCE TO RELATED APPLICATIONS

This patent application is a divisional application which claims priority to pending application Ser. No. 09/032,473 (status: abandoned), filed 26 Feb. 1998, which claims the benefits of the following provisional application under 35 USC 119(e): commonly-owned copending U.S. patent application entitled "MICROELECTRONIC CONTACT STRUCTURES," Ser. No. 60/073,679 filed 4 Feb. 98 by Pedersen and Khandros, incorporated by reference herein.

Application Ser. No. 09/032,473 is also a continuation-in-part of commonly-owned, U.S. patent application Ser. No. 08/852,152 filed 6 May 97 by Eldridge, Khandros, Mathieu and Pedersen (status: now U.S. Pat. No. 6,184,053) and its counterpart PCT Patent Application No. US97/08634 filed 15 May 97 (status: published as WO97/43654, 20 Nov. 97), both of which are incorporated by reference herein, both of which are referred to hereinafter as the "PARENT CASE".

TECHNICAL FIELD OF THE INVENTION

The present invention relates to resilient (spring) contact (interconnection) elements (structures) suitable for effecting pressure and/or compliant connections between electronic components and, more particularly, to microminiature contact structures.

BACKGROUND OF THE INVENTION

Commonly-owned, U.S. patent application Ser. No. 08/452,255 filed 26 May 95 by Eldridge, Grube, Khandros and Mathieu (status: now U.S. Pat. No. 6,336,269) and its counterpart PCT patent application number PCT/US95/14909 filed 13 NOV 1995 (status: published as WO95/14909, 06 Jun. 96) disclose methods for making resilient interconnection elements for microelectronics applications involving mounting an end of a flexible elongate core element (e.g., wire "stem" or "skeleton") to a terminal on an electronic component, coating the flexible core element and adjacent surface of the terminal with a "shell" of one or more materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element may be used to effect pressure, or demountable, connections between two or more electronic components, particularly microelectronic components, including semiconductor devices.

The aforementioned PARENT CASE discloses fabricating spring contact elements by depositing at least one layer of metallic material into openings defined in multiple masking layers deposited on a surface of a substrate which may be an electronic component such as an active semiconductor device. Each spring contact element has a base end, a contact end, and a central body portion. In an embodiment disclosed therein, the contact end may be offset in the z-axis (at a different height) and in at least one of the x and y directions from the base end. In this manner, a plurality of spring contact elements are fabricated in a prescribed spatial relationship with one another on the substrate. The spring contact elements make temporary (i.e., pressure) or permanent (e.g., joined by soldering or brazing or with a conductive adhesive) connections with terminals of another electronic component to effect electrical connections therebetween. In an exemplary application, the spring contact elements are disposed on a semiconductor devices resident on a semiconductor wafer so that temporary connections can be made with the semiconductor devices to burn-in and/or test the semiconductor devices prior to their being singulated from the semiconductor wafer.

As in the PARENT CASE, the present invention addresses and is particularly well-suited to making interconnections to modern microelectronic devices having their terminals (bond pads) disposed at a fine-pitch. As used herein, the term "fine-pitch" refers to microelectronic devices that have their terminals disposed at a spacing of less than 5 mils, such as 2.5 mils or 65 μm. As will be evident from the description that follows, this is preferably achieved by taking advantage of the close tolerances that readily can be realized by using lithographic rather than mechanical techniques to fabricate the contact elements.

Commonly-owned, U.S. patent application Ser. No. 08/955,001 filed 20 Oct. 97 by Eldridge, et al. (status: now U.S. Pat. No. 6,043,563), incorporated by reference herein, also addresses and is particularly well-suited to making interconnections to modern microelectronic devices having their terminals (bond pads) disposed at a fine-pitch. As described therein, spring contact elements may be fabricated at areas on an electronic component which are remote from terminals to which they are electrically connected, and electrically connected to the terminals via conductive lines which extend from terminals of an electronic component to positions which are remote from the terminals. In this manner, a plurality of substantially identical spring contact elements can be mounted to the electronic component so that their free ends are disposed in a pattern and at positions which are spatially-translated from the pattern of the terminals on the component. The spring contact elements include, but are not limited to, composite interconnection elements and plated-up structures. The electronic component includes, but is not limited to, a semiconductor device, a memory chip, a portion of a semiconductor wafer, a space transformer, a probe card, a chip carrier, and a socket.

SUMMARY OF THE INVENTION

An object of the present invention is to provide an improved technique for fabricating spring contact elements.

Another object of the invention is to provide a technique for fabricating spring contact elements using processes that are inherently well suited to the fine-pitch, close-tolerance world of microelectronics.

Another object of the invention is to provide a technique for fabricating microminiature spring contact elements directly on active electronic components, such as semiconductor devices, without damaging the semiconductor devices. This includes fabricating microminiature spring contact elements on semiconductor devices resident on a semiconductor wafer, prior to the semiconductor devices being singulated from the semiconductor wafer.

Another object of the invention is to provide a technique for fabricating spring contact elements that are suitable for socketing (one form of releasably connecting to) electronic components such as semiconductor devices, such as for performing burn-in on said devices.

According to the invention, microelectronic contact structures are fabricated by applying a masking layer on a surface of an electronic component, creating openings in the masking layer, depositing conductive traces onto the masking layer and into the openings, and building up masses of conductive material on the conductive traces. The masses of conductive material each represent a contact structure having its base end extending up through the opening, having a main body portion extending across the masking layer (on the conductive trace), and having a tip end.

According to an aspect of the invention, the sidewalls of the openings in the masking layer may preferably be tapered (sloped). Techniques for forming tapered (sloped) openings are disclosed herein.

According to an aspect of the invention, the conductive traces may be deposited onto the masking layer using a stencil (shadow mask).

According to an aspect of the invention, the openings in the masking layer defining the base ends of selected ones of the contact structures can be located over contact pads of the electronic component. Alternatively, the openings in the masking layer defining base ends of selected ones of the contact structures can be located remote from the contact pads and connected to the contact pads by a patterned conductive layer underlying the masking layer.

According to an aspect of the invention, protruding features may be disposed on the masking layer so that tip ends of the contact structures are offset from main body portions of the contact structures.

The electronic component may include, but is not limited to, an active semiconductor device, a memory chip, a portion of a semiconductor wafer, a space transformer, a probe card, a chip carrier, and a socket. In other words, the electronic component may be a passive device that supports one or more electronic connections. It is particularly preferred to add the microelectronic contact structures of this invention to an active electronic device, particularly a silicon semiconductor device.

The contact structures of this invention are suitable for making either temporary or permanent electrical connections to terminals of another electronic component such as a printed circuit board (PCB) interconnection substrate.

For making temporary connections, the component upon which the contact structures are fabricated is brought together with the other electronic component so that the tip ends of the contact structures make pressure connections with the terminals of the other electronic component. The contact structures react resiliently (in elastic deformation mode) to maintain contact pressure and electrical connections between the two components.

For making permanent connections, the component upon which the contact structures are fabricated is brought together with the other electronic component, and the tip ends of the contact structures are joined, such as by soldering or brazing or with a conductive adhesive, to the terminals of the other electronic component. The contact structures are compliant, and accommodate differential thermal expansion between the two electronic components.

The contact structures of the present invention can be fabricated directly on the surface of a semiconductor device, or on the surfaces of a plurality of semiconductor devices resident on a semiconductor wafer. In this manner, a plurality of semiconductor devices resident on a semiconductor wafer can be "readied" for burn-in and/or test prior to being singulated from the semiconductor wafer.

According to an aspect of the invention, the tapered (sloped) openings in the masking layer manifest themselves as tapered (sloped) regions in the seed layer, as well as in tapered (sloped) regions of the resulting contact structures formed on the seed layer.

Other objects, features and advantages of the invention will become apparent in light of the following description thereof.

Briefly, the present invention is directed to the fabrication of one or more microelectronic contact structures. Such a structure may be fabricated by applying a masking layer on a surface of an electronic component, creating an opening in the masking layer, depositing a seed layer (preferably as a conductive trace) onto the masking layer and into the opening, and building up a mass of conductive material on the conductive trace. The sidewalls of an opening can be tapered. Techniques for tapering the sidewalls of the opening are disclosed. The conductive traces can be deposited through a stencil (shadow mask), thereby obviating a need for an additional masking layer. A protruding feature, such as in the form of a dot of insulating material, may be disposed on the masking layer so that the tip end of the resulting contact structure has a topology. The mass of conductive material has a generally hemispherical lateral cross section as built up on the seed layer. The opening in the masking layer, defining a base end of the contact structure, can be over a contact pad of the electronic component, or remotely located therefrom and connected to the contact pad by a conductive trace.

Significant differences between the technique of the present invention and those disclosed in the PARENT CASE include, but are not limited to:

a) In the PARENT CASE, the contact structure is built up in a multilevel trough in multilevel masking layers. The creation of such a multilevel trough is relatively complicated as compared with the relatively straightforward technique of the present invention that involves forming of openings (222) in a masking layer (220), preferably a single masking layer which can be patterned in a single step.

b) The technique of the present invention facilitates the formation of tapered sidewalls (e.g., of the openings 222) which provide a smooth transition from one level of the contact structure (e.g., its base portion) to another level of the contact structure (e.g., its main body portion).

c) The "third level"—namely the tip end of the contact structure is defined by the relatively straightforward instrumentality of a protruding feature (230) as opposed to another trough in another masking layer.

d) The overall shape (geometry) of the contact structure is determined by and built up upon a conductive trace (250) rather than in a trough. As a general proposition, it is somewhat easier to reliably and controllably plate "onto" something (i.e., a conductive trace) than to plate "into" something (i.e., a trough). For implementing curved (versus linear) contact structures, this greatly simplifies pattern formation.

e) The overall shape of the contact structure in the x and y dimensions (where the electronic component has a surface which is in the xy plane) is defined primarily by a stencil or shadow mask. In contrast, the x and y shape in the PARENT CASE is defined primarily by patterning various layers of masking material.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments. Certain elements in selected ones of the drawings are illustrated not-to-scale, for illustrative clarity. Often, similar elements throughout the drawings are referred to by similar reference numerals. For example, the element 199 may be similar in many respects to the element 299 in another figure. Also, often, similar elements are referred to with similar numbers in a single drawing. For example, a plurality of elements 199 may be referred to as 199*a*, 199*b*, 199*c*, etc.

FIG. 2D is a side cross-sectional view of another step in the first exemplary embodiment of a process for making a contact structure, according to the invention.

FIG. 2E is a side cross-sectional view of another step in the first exemplary embodiment of a process for making a contact structure, according to the invention.

FIG. 2F is a top plan view of interim products formed in the step shown in FIG. 2E, according to the first exemplary embodiment of a process for making a contact structure, according to the invention.

FIG. 2I illustrates a structure resulting from partially coating the sidewalls of an opening, as shown in FIGS. 2E and 2G generally. FIG. 2J shows a structure resulting from fully coating the sidewalls of an opening, as shown in FIGS. 4E and 4G.

FIG. 6A is a top plan view of an embodiment of a tip end of a contact structure, according to the invention.

FIG. 6B is a top plan view of another embodiment of a tip end of a contact structure, according to the invention.

FIG. 7 illustrates a top plan view of a preferred embodiment of a spring shape, according to the invention.

DETAILED DESCRIPTION OF THE INVENTION

Prior to describing the techniques and resulting microelectronic contact structures of the present invention, a brief review of the techniques described in the PARENT CASE is useful. Although there is some commonality between the materials and processes employed by the present invention and those of the PARENT CASE, and both are directed to fabricating microelectronic contact structures which may be spring contact elements, noticeable and dramatic differences will become evident in the discussion that follows.

Figure 1A:
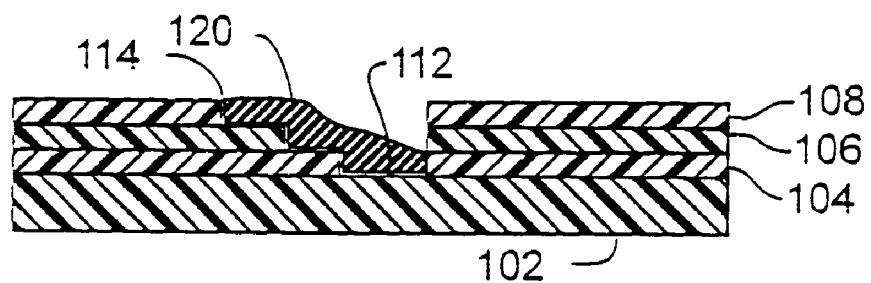
FIG. 1A is a side cross-sectional view of a technique for making a spring contact element, as disclosed in the PARENT CASE.
Figure 1B:
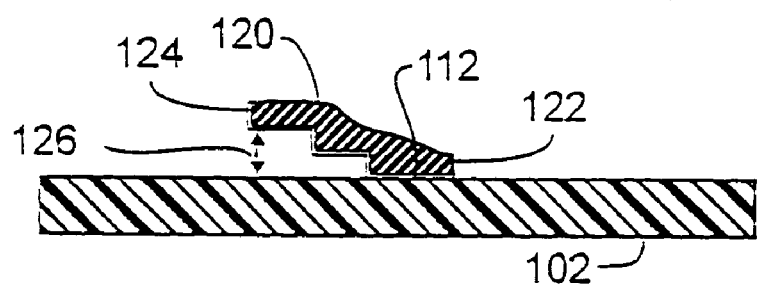
FIG. 1B is a side cross-sectional view of the spring contact element of FIG. 1A, as disclosed in the PARENT CASE.
Figure 1C:
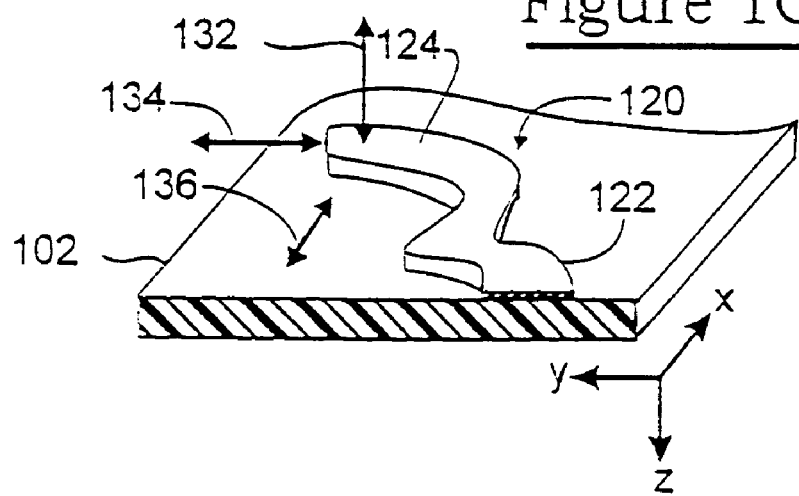
FIG. 1C is a perspective view of the spring contact element of FIG. 1B, as disclosed in the PARENT CASE.

FIGS. 1A-1C illustrate a technique of fabricating microelectronic contact structures which are spring contact elements, by depositing at least one layer of metallic material into openings defined in multiple masking layers deposited on a surface of a substrate which may be an electronic component such as an active semiconductor device, as disclosed in the aforementioned PARENT CASE. Generally, a number of insulating layers having openings formed therein are aligned and "seeded" with a layer of conductive material. A mass of conductive material can then be formed (or deposited) in the seeded opening(s), such as by electroplating (or CVD, sputtering, electroless plating, etc.). After the insulating layers are removed, the masses can function as freestanding resilient contact structures which extend not only vertically above the surface of the component, but also laterally from the location whereat they are mounted. In this manner, the contact structures are readily engineered to be compliant in both the Z-axis as well as in the x-y plane (parallel to the surface of the component). Note that in reference to FIGS. 1A, 1B and 1C "above" is to be read in the sense of the drawing only as the three dimension relationships can be transformed, translated and rotated generally and remain within the teachings of the invention.

FIG. 1A is illustrative of an exemplary technique for fabricating one of a plurality of freestanding resilient (spring) contact elements 120 on a substrate 102. The substrate 102, for example, may be an active electronic component, including semiconductor devices, including semiconductor devices resident on a semiconductor wafer.

The substrate 102 has a plurality (one of many shown) or areas 112 on its surface whereat the spring contact elements will be fabricated. In the case of the substrate 102 being an electronic component (such as a semiconductor device), these areas 112 preferably would be terminals (such as bond pads) of the electronic component.

Generally, the technique involves applying a number (three shown) of patterned masking layers 104, 106 and 108 having openings onto the surface of the substrate. The layers are patterned to have openings (as shown) aligned with the areas 112, and the openings are sized and shaped so that an opening in a one layer (e.g., 108, 106) extends further from the area 112 than an opening in an underlying layer (e.g., 106, 104, respectively). In other words, the first layer 104 has an opening, which may be over the area 112. A portion of the opening in the second layer 106 is aligned over at least a portion of the opening in the first layer 104 and, conversely, a portion of the first layer 104 extends under a portion of the opening in the second layer 106. Similarly, a portion of the opening in the third layer 108 is aligned over at least a portion of the opening in the second layer 106 and, conversely, a portion of the second layer 106 extends under a portion of the opening in the third layer 108. The bottom portion of a given overall opening is over the selected area 112 and its top portion is elevated from its bottom portion. As will be discussed in greater detail hereinbelow, a conductive metallic material is deposited into the openings, and the masking layers are removed, resulting in a free-standing contact structure having been fabricated directly upon the substrate with its base end secured to the substrate 102 at the area 112 and its free end extending both above the surface of the substrate and laterally-displaced from the area 112.

If required, such as for electroplating, a thin (e.g., 4500 Å) "seed" layer of conductive material 114 such as titanium-tungsten (Ti—W) may be deposited into the openings. Then, a mass of conductive metallic material (e.g., nickel) 120 can be deposited by electroplating into the openings.

FIGS. 1B and 1C illustrate a resulting spring contact element 120 having its base end 122 adjacent the area 112, and its free-end (tip) 124 elevated in the z-axis above the surface of the substrate 102 as well as laterally offset in the x-axis and y-axis from the base end 122.

As best viewed in FIG. 1C, the contact element 120 will react to pressure applied in the z-axis at its tip end 124, as indicated by the arrow 132, such as would result from making a temporary pressure electrical connection with a terminal (not shown) of another electronic component (not shown). Compliance in the z-axis ensures that contact force (pressure) will be maintained, and also accommodates non-planarities (if any) between terminals (not shown) on the other electronic component (not shown). Such temporary electrical connections are useful for making temporary connections to the electronic component 102, such as for performing burn-in and/or testing of the component 102.

The tip end 124 may also be free to move compliantly in the x- and y-directions, as indicated by the arrows 136 and 134, respectively. This would be important in the context of joining (by soldering, or brazing, or with a conductive adhesive) the tip end 124 to a terminal (not shown) of another electronic component (not shown) which has a different coefficient of thermal expansion than the substrate (component) 102. Such permanent electrical connections are useful for assemblies of electronic components, such as a plurality of memory chips (each of which is represented by the substrate 102) to another electronic component such as an interconnection substrate such as a printed circuit board ("PCB"; not shown).

By suitable choice of material and geometry, these fabricated masses 120 can function as freestanding resilient contact structures that have been fabricated with very precise dimensions and very precise spacings from one another. For example, tens of thousands of such spring contact elements (120) are readily precisely fabricated on a corresponding number of terminals on semiconductor devices that are resident on a semiconductor wafer (not shown).

The resulting spring contact elements 120 are principally, preferably entirely, metallic, and may be formed (fabricated) as multilayer structures. Suitable materials for the one or more layers of the contact structures are set forth in the PARENT CASE. A representative one of those materials is nickel (and its alloys).

Thus, the PARENT CASE describes a method of fabricating spring contact elements (120) directly on a substrate (102) such as an electronic component, such as a semiconductor device which may be resident on a semiconductor wafer, by applying at least one layer of masking material (104, 106, 108) on a surface of the substrate (102) and patterning the masking layer to have openings extending from areas (112) on the substrate to positions which are spaced above the surface of the substrate and which also are laterally and/or transversely offset from the areas 112); by optionally seeding (114) the openings; by depositing at least one layer of a conductive metallic material into the openings; and by removing the masking material so that the remaining conductive metallic material forms free-standing contact elements extending from the surface of the substrate, each contact element having a base end which is secured to a one of the areas of the substrate and having a tip end for making an electrical connection to a terminal of an electronic component. As will become evident from the description that follows, the techniques of the present invention, in at least certain respects, dramatically simplify the process of fabricating microelectronic contact structures.

An Exemplary Process of the Present Invention

The process described hereinabove with respect to FIGS. 1A-1C utilizes three layers (104, 106, 108) of masking material which must be patterned and applied upon one another, resulting in a multi-level trench into which the material 120 must be deposited.

According to the present invention, a comparable microelectronic contact structure (hereinafter "contact structure") can be fabricated with fewer layers of masking material (e.g. photoresist). FIGS. 2A-2L illustrate an embodiment of the technique of the present invention.

Figure 2A:
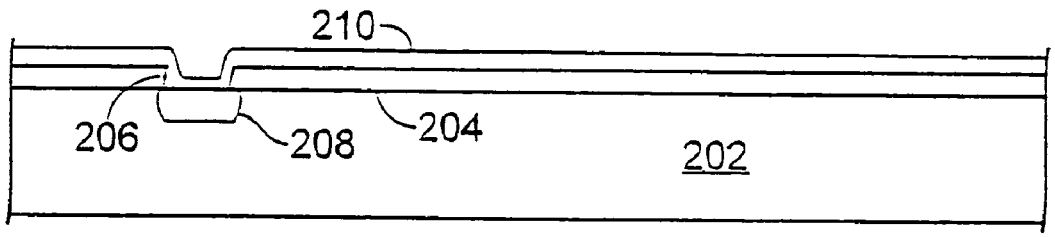
FIG. 2A is a side cross-sectional view of a step in a first exemplary embodiment of a process for making a contact structure, according to the invention.

FIG. 2A shows an exemplary electronic component 200 upon which a plurality of contact structures can be fabricated. In the main hereinafter, the fabrication of a single contact structure (260) will be described as exemplary of fabricating a plurality of such contact structures, preferably all at the same time on the same component. Typically, each of the contact structures fabricated on a single component will be substantially identical to one another (i.e., dimensions, shape, etc.), but it is within the scope of this invention that the dimensions and shape of each contact structure can individually be controlled and determined by the designer for given application requirements.

In this example, the electronic component 200 is a semiconductor device comprising a silicon substrate 202, a passivation layer (e.g., polyimide, 4 μm thick) 204 disposed on the surface of the silicon substrate 202, and a plurality (one of many shown) of openings 206 extending through the passivation layer 204 to a metallic contact pad 208. Typically, there are a plurality of such contact pads on an electronic component. In a complete assembly, each contact pad is commonly (i.e., according to the prior art) connected (e.g., with a bond wire) to a corresponding contact pad on another electronic component (not shown), such as a thin small-outline package (TSOP).

As shown in FIG. 2A, in a first step of the process, a conductive layer 210 is deposited. The conductive layer 210 is, for example, titanium-tungsten (Ti—W) which may be deposited by sputtering to a thickness of about 3000-6000 Å (Angstroms), such as to a thickness of about 4500 Å. The conductive layer 210 substantially conformally and contiguously covers the surface of the passivation layer 204, the sidewalls of the opening 206 and the exposed (within the opening) surface of the metallic contact pad 208. The conductive layer 210 is preferably electrically conductive and, if deposited as a continuous "blanket" layer, will electrically short together all of the contact pads (208) of the electronic component. As will become evident from the description that follows, this shorting feature of the conductive layer 210 can advantageously be employed to establish an appropriate potential for an electrolytic process (e.g., electroplating) for fabricating contact structures on the electronic component.

It is within the scope of this invention that the conductive layer 210 can also be patterned, rather than continuous, and can be deposited as multiple, non-contiguous regions. In a preferred embodiment, the conductive layer 210 covers the exposed surface of terminal 208. In an alternative embodiment, the conductive layer 210 covers only a portion of terminal 208. In another alternative embodiment, conductive layer 210 does not cover terminal 208 at all but is in the general area of terminal 208 such that when seed layer 250 is applied, it makes contact with conductive layer 210.

It is also within the scope of the invention that a second conductive layer (412, described hereinbelow), of another material (such as gold) can be deposited and patterned onto the conductive layer 210 (see the analogous conductive layer 410, described hereinbelow in the description of FIG. 4A). This can be used, for example, to effect local interconnections and rerouting of signals from the contact pad 208 to the contact structure (260). In general, a dual layer may be preferred for many applications. Selection of suitable materials is within the skill in the art.

It is within the scope of the invention that the contact pad (208) is on or in (yet exposed) the surface of the substrate (202) itself, without there being a passivation layer (204), although a passivation layer is commonly present on semiconductor devices. Prior to depositing the conductive layer 210, the passivation layer 204 (if there is one present) may optionally first be "roughed up" to enhance adhesion of the conductive layer 210 to the passivation layer 204. This can simply be accomplished by exposing the electronic component 200 to an oxygen ($O_2$) plasma with suitable parameters (that may be determined readily by one skilled in the art) to obtain a desired surface texture on the passivation layer. Choice of materials will also affect adhesion of the seed layer to the passivation layer. Titanium-tungsten (Ti—W) or copper, for example, are known to adhere well to polyimide.

Figure 2B:
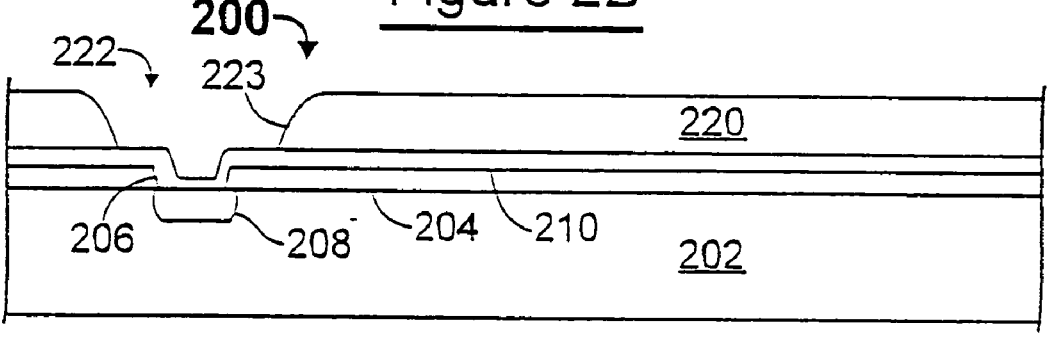
FIG. 2B is a side cross-sectional view of another step in the first exemplary embodiment of a process for making a contact structure, according to the invention.

As shown in FIG. 2B, in a next step of the process, a layer of masking material (e.g., photoresist) 220 is deposited onto the surface of the component 202 (i.e., onto the conductive layer 210) and is patterned (e.g., using conventional photolithographic techniques) to include an opening 222 extending completely through the masking layer 220. The opening 222 may be located either at a position which is over (as shown) the opening 206 in the passivation layer 204, or may be located at a position (as described hereinbelow) which is remote from the opening 206 and, consequently, remote from the contact pad 208.

As described in greater detail hereinbelow, by locating the openings 222 at positions remote from the contact pads 208, a plurality of contact structures can be fabricated on the electronic component with a layout that differs from that of the contact pads of the electronic component. One particularly preferred configuration is to position openings 222 so that contact structures built thereon will have tips in an area array comparable to a ball grid array. The openings can be connected to contact pads on the electronic component arranged, for example, as peripheral pads. It may be advantageous to make the contact structures substantially identical without displacement from the contact pads. In this instance, it is useful to locate openings 222 in an area array corresponding to the array of the tips of the ultimate contact structures.

Each opening 222 preferably has a larger area than the area of opening 206 over the contact pad 208. For example, a square contact pad 208 measuring 4 mils×4 mils (i.e., 100 μm×100 μm) would have an exposed area of 10,000 $\mu m^2$, and a square opening 222 measuring 200 μm×200 μm would have an area of 40,000 (four times the exposed area of the contact pad 208). A circular opening 222 having a diameter of 200 μm would have an area of 31,400 $\mu m^2$ (approximately three times the exposed area of the contact pad 208). In general, it is preferred that the opening exposes an area of the terminal and/or substrate of between about 10,000 and about 40,000 $\mu m^2$, most preferably in excess of about 30,000 $\mu m^2$. Although not a key feature of the invention, as a general proposition, the footprint (base end area) of the contact structure should provide sufficient area for the mechanical securement (adhesion) of the contact structure to the electronic component.

Regarding the openings 222, it is preferred that they be tapered (as discussed in greater detail hereinbelow, with respect to FIGS. 5D-5F), and that the dimensions at the bottom of a tapered opening be on the order of 200 µm×200 µm for a square opening, or 200 µm diameter for a circular opening. In applications that are space-constrained, and these dimensions are not possible, the available space can be used. For example, when dealing with an electronic component having 100 µm×100 µm pads on 125 µm centers, the openings 222 can have dimensions on the order of 105 µm×105 µm, 110 µm×110 µm, or the like. Alternatively, in applications that are space-constrained, the bases of the contact structures can be remotely located (as described hereinbelow) from the pads to which they are electrically connected and have larger (e.g., 200 µm) preferred dimensions. The tapered (sloped) region of the opening 222 is designated by the reference numeral 223 in FIG. 2B.

The masking layer 220 is preferably deposited to a thickness of at least about 50 µm, including at least about 100 µm, at least about 150 µm, and at least about 200 µm. The masking layer 220 can be deposited as multiple layers. It is the overall thickness of the masking layer 220 that will determine primarily the distance that the main body portion of the contact structure is spaced away from the surface of the electronic component. Note the offset distance "d2" of the main body portion 266 from the base portion 262 of the spring contact element 260 shown in FIG. 2L. Compare FIG. 3A of the aforementioned PARENT CASE.

Preferably, the sidewalls (edgewalls) of the openings 222 are tapered so that the opening may be larger at the surface of the masking layer 220 than at the conductive layer 210. This is referred to as a "positive" taper. No taper would result in steep sidewalls having an angle of 90° (ninety degrees). Preferably, the sidewalls of the openings have an average taper angle of about 60-75°. This may readily be accomplished using photoresist as the material for the masking layer 220, and baking the photoresist and re-flowing it. One having ordinary skill in the art to which the present invention most nearly pertains will readily understand how to control the sidewall taper in light of the description presented herein. It is within the scope of this invention that the tapered opening can be formed in any suitable manner and may, in fact, be stepped like an inverted, stepped, truncated pyramid. Controlling the shape of the opening (222) in the masking layer (220) is discussed in greater detail hereinbelow.

Figure 2C:
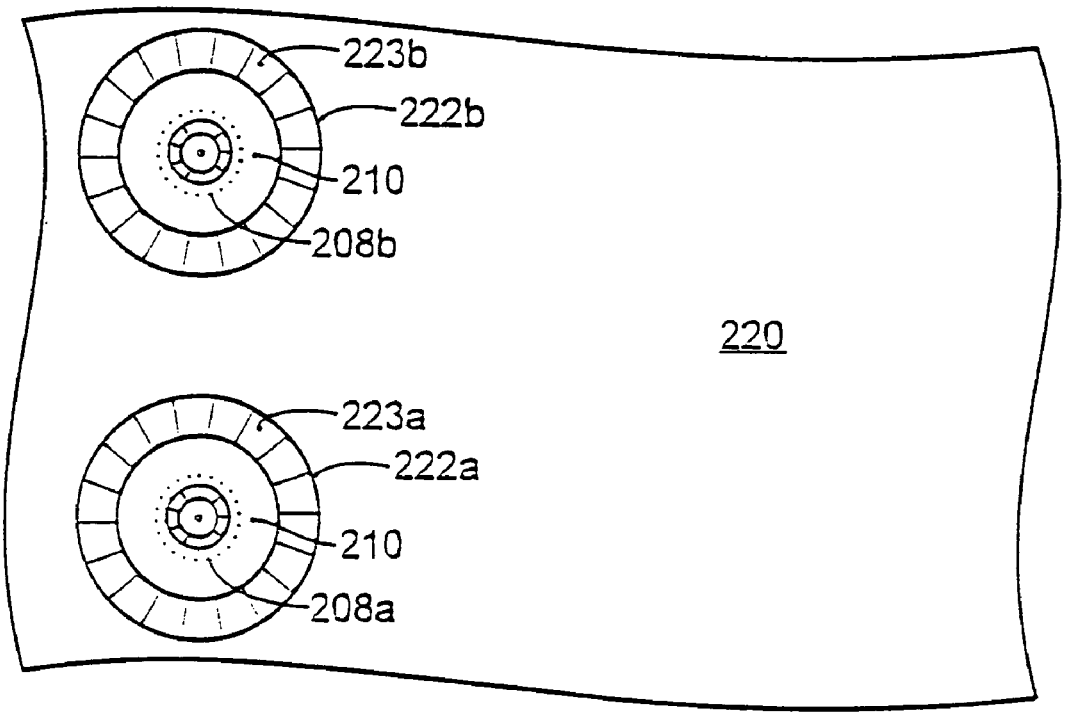
FIG. 2C is a top plan view of an interim product formed in the step shown in FIG. 2B, according to the first exemplary embodiment of a process for making a contact structure, according to the invention.

FIG. 2C is a top plan view of the electronic component 200 of FIG. 2B, showing two openings 222a and 222b in the masking layer 220, each opening associated with a one of two contact pads 208a and 208b (shown in dashed lines), respectively. The tapered regions of the openings 222a and 222b are designated by the reference numerals 223a and 223b, respectively, in this figure.

As shown in FIG. 2D, in a next step of the process, for each of selected ones of the plurality of openings 222, a protruding feature 230 may be deposited onto the surface of the masking layer 220 with its center at a distance "L" from the a center of the opening 222. As will become evident, this feature 230 will define the contact (tip) end (264) of a resulting contact structure (260) being fabricated on the electronic component, and the distance "L" represents the straight-line distance between the base (262) and tip (264) ends of the contact structure (260) being fabricated on the electronic component. The protruding feature 230 can be a "dot" or "dollop" of material, for example exhibiting a squashed hemispherical shape, and may be a small quantity of epoxy, photoresist, or the like which may suitably be applied through a stencil or by using conventional screen printing techniques. The protruding feature 230 may also be of a conductive material. Suitable dimensions for a protruding feature 230 in the form of a squashed hemispherical dot are about 5-15 mils (125-375 µm) in diameter and about 2 mils (50 µm) in height. It is within the scope of this invention that the protruding feature can be skinnier (e.g., less than about 5 mils wide), or that it can be wider (e.g., greater than about 15 mils wide). Preferably, however, for most applications, it is preferred that its height be in the range of about 2.0-7.5 mils.

As described in greater detail hereinbelow, other shapes for the protruding feature—more broadly, a variety of shapes for the resulting tip end (264) of the contact structure (260) being fabricated, including pyramidal, conical or hemispherical, and truncated versions of pyramidal, conical or hemispherical, and cruciform, rings and the like, are within the scope of the present invention.

One having ordinary skill in the art to which the present invention most nearly pertains will readily understand how to apply and control the shape of the protruding features 230 in light of the description presented herein. For example, using photoresist and a stencil (not shown) to create the protruding features 230, with the stencil in place, the photoresist can be soft-baked to release the protruding feature from the stencil then, after removing the stencil, hard-baked.

The distance "L", between the base end (262) and tip end (264) of the resulting microelectronic spring contact structure may be, for example, in the range of about from 10-1000 mils, preferably in the range of from 10-50 mils.

As shown in FIG. 2E, in a next step of the process, a stencil (shadow mask) 240 may be disposed over the surface of the masking layer 220. The stencil 240 has a plurality (one of many shown) of openings 242. As illustrated, an opening 242 extends from opening 222 to a corresponding protruding feature 230. The stencil 240 may suitably be a thin (e.g., about 2 mil thick) foil of stainless steel which may be punched or etched to have openings 242. Stencil 240 can be of any suitable material having any suitable thickness which will permit a seed layer 250 to be deposited onto the masking material 220 in a pattern of conductive traces corresponding to the shapes of the openings 242.

With the stencil 240 in place on the surface of the masking layer 220, a "seed" layer 250 is deposited, such as by sputtering, onto the exposed surfaces of the masking layer 220 and protruding features 230. The seed layer 250 is deposited within the exposed portions of opening 222 and onto the surface of the conductive layer 210 within opening 222. The seed layer 250 has a sloped region 253 where it is deposited on the sloped region 223 of the opening 222 in the masking material 220.

The seed layer 250 may be deposited as a pattern of a plurality of "traces", each of which is a physical realization of the pattern of openings 242 in the overlying stencil 240. The seed layer 250, as patterned, serves as a precursor for a contact structure to be fabricated on the electronic component. For example, in an electroplating process, the conductive traces of the seed layer 250 will each serve as an electroform whereupon the substance (mass) of the contact structure (260) can be fabricated.

The selection of masking material 220 and process for deposition of seed layer 250 need to be considered together. The masking material needs to be stable in the environment of the deposition method. For example, a typical positive photoresist material contains some solvent and may outgas under high vacuum conditions. It is preferable in this instance to modify the material, for example by baking or exposure to light in order to cross-link or otherwise rigidify the masking material. Polyimide is a useful masking material and will tolerate a sputtering environment without significant degradation. Deposition also can be by means of chemical vapor deposition (CVD) or e-beam processes. These require less vacuum than does sputtering. For these, traditional Novolac photoresist resins can be used, perhaps with some moderate cross-linking. Another consideration is that any modification to the masking material to make it stable under vacuum may make it more difficult to remove later in the process. A suitable material and process can be selected by one skilled in the art. One particularly preferred process is to use Novolac photoresist, patterned as described above, then partially cross-linked by heating. Deposition of seed layer 250 is performed using CVD.

FIG. 2F illustrates the result of the steps described in FIG. 2E in top view, and shows two openings 242*a* and 242*b* in a stencil 240, each opening 242*a* and 242*b* extending from over an associated one of two contact pads 208*a* and 208*b* (shown in dashed lines) to a selected one of two protruding features 230*a* and 230*b* (shown in dashed lines), respectively.

FIG. 2F also illustrates two patterned traces 250*a* and 250*b* of the seed layer having been deposited through the openings 242*a* and 242*b*, respectively, in the stencil 240. The traces 250*a* and 250*b* are illustrated with cross-hatching, for illustrative clarity, but it should clearly be understood that this cross-hatching does not indicate a cross-section in this figure.

Each of the traces 250*a* and 250*b* illustrated in FIG. 2F has a base end 252*a* and 252*b*, a tip end 254*a* and 254*b*, and a central body portion 256*a* and 256*b*, respectively, corresponding to the base ends (262), tip ends (264) and main body portions (266), respectively, of contact structures (260) that will be built up onto the conductive traces 250*a* and 250*b*. The sloped regions 253*a* and 253*b* of the traces 250*a* and 250*b*, respectively, are illustrated in this figure.

Figure 2G:
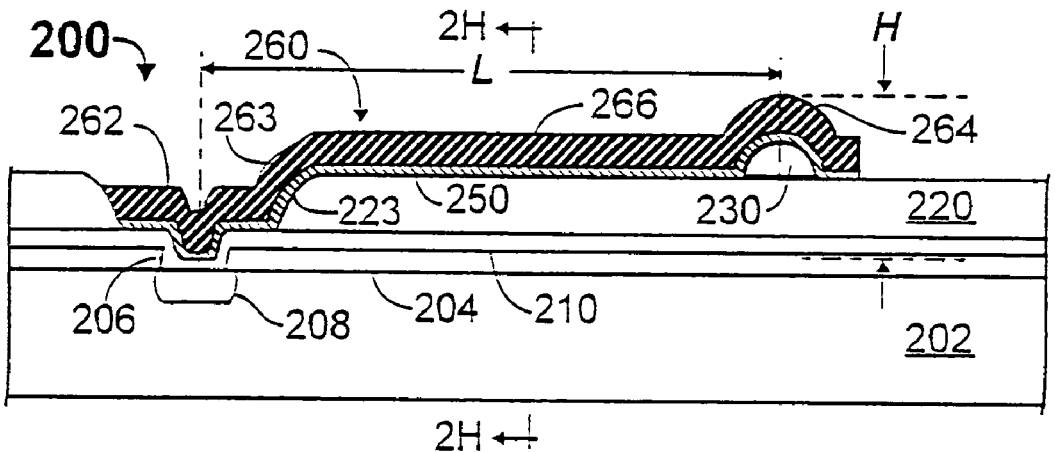
FIG. 2G is a side cross-sectional view of another step in the first exemplary embodiment of a process for making a contact structure, according to the invention.

FIG. 2G illustrates a next step of the process, wherein the shadow mask 240 has been removed and a plurality (one of many shown) of contact structures 260 are built up, such as by plating (e.g., electroplating), as a mass of conductive material upon the plurality (one of many shown) of traces 230. Each contact structure 260 has a base end portion 262 (compare 302 of the PARENT CASE), a tip end portion 264 (compare 304 of the PARENT CASE), and a main body portion 266 (compare 306 of the PARENT CASE) extending between the base end portion 262 and the tip end portion 264. As illustrated, the contact structure 260 has a sloped region 263 between its base end 262 and its main body portion 266, the sloped region 263 being built on the sloped region 253 of the seed layer 250 which, in turn, is built on the sloped region 223 of the opening 222 in the masking material 220.

Figure 2H:
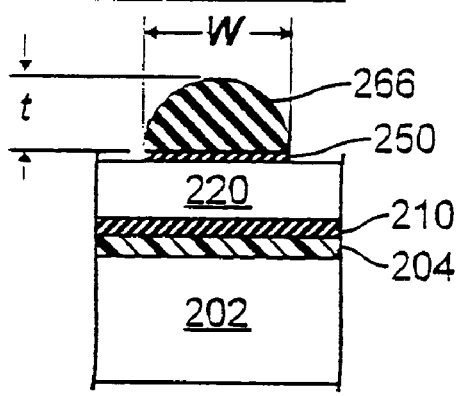
FIG. 2H is an end cross-sectional view of the product formed by the step shown in FIG. 2G, according to the first exemplary embodiment of a process for making a contact structure, according to the invention.

FIG. 2H is a cross-sectional view of the electronic component 200 of FIG. 2H, taken on a line 2H-2H, illustrating the profile (transverse cross-section) of a contact structure (260) made according to one preferred implementation of the invention. The profile is roughly semicircular or mushroom-shaped. This section, taken through the main body portion 266 is representative of the profile of the contact structure throughout its entire length. This structure is a result of electroplating on an exposed seed layer that is approximately planar.

As best viewed in FIG. 2G (see also FIG. 2M), the overall height "H" of the resulting contact structure 260, in other words the height of its tip end 264 away from the surface of the substrate 202, is preferably at least about 4.0 mils, and may be about 8.0 mils or greater.

As best viewed in FIG. 2H, the thickness "t" of the contact structure 260 itself—in other words, of the mass of conductive material on the trace 250—is preferably at least about 0.5 mils and may be about 1.5 mils or greater.

As best viewed in FIG. 2H, the width "w" of the contact structure 260 itself—in other words, of the mass of conductive material on the trace 250—is preferably at least about 0.5 mils and may be about 4.0 mils or greater. The width may be constant along the main body portion 266, or the main body portion may be tapered in width, for example, from wider near the base end 264 to narrower near the tip end 266 of the main body portion 266.

As mentioned hereinabove, the length "L", between the base end (262) and tip end (264) of the resulting microelectronic contact structure (260) is suitably at least about 10 mils and may be as long as about 50 mils or greater.

The general requirements for the design of a spring shape are generally known in the art. Details such as dimensions, bending moment, shape to allow flexibility in various dimensions, and the like can be selected by the designer and implemented according to the teachings of this invention. One Particularly preferred shape approximates a circular section with a tapered inner and outer radius of curvature. Such a shape is illustrated in FIG. 7.

Figure 2I:
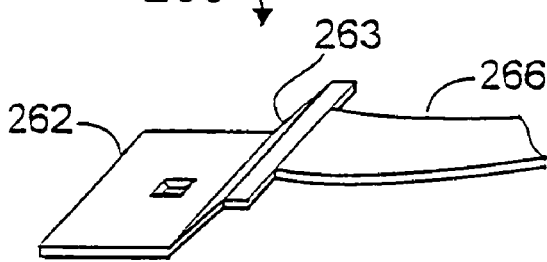
FIGS. 2I and 2J are perspective views of two of many possible configurations for the contact structure of the present invention, highlighting its funnel-like base end.
Figure 2J:
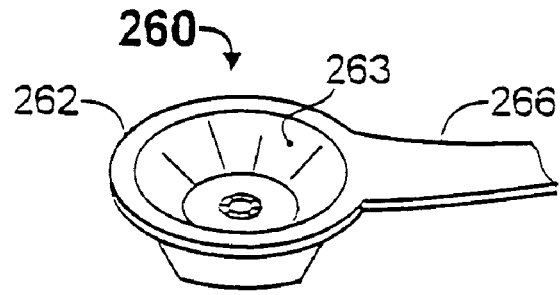

FIGS. 2I and 2J are perspective views of two of many possible configurations for the contact structure 260 of FIG. 2G, disassociated from the component 200, for illustrative clarity. These figures illustrate two important variations that can be selected using this invention. In FIG. 2I, the contact structure has a square base end 262. In FIG. 2J, the contact structure has a round (circular) base end 262. In both of these figures, the funnel shape of the base end in the sloped region 263 is readily appreciated, said shape having been imparted to the base end by the sloping sidewalls (223) of the opening 222 in the masking layer 220. In FIG. 2J, the sloped region 263 of the base end 262 is completely covered (360°), and a small "lip" extends around the entire base end. This complete funnel shape is readily obtained using a stencil 440 that allows deposition of a seed layer along all of the side walls and a portion of the surface of masking layer 420. Such a stencil is illustrated in FIG. 4E, and the resulting structure is illustrated in FIG. 4G. FIG. 2I shows the result of depositing a seed layer on only a portion of the sidewalls of opening 222. This is readily obtained using a stencil that covers a portion of opening 222, as illustrated in FIG. 2E. More or less of the sidewalls can be covered according to the mask and deposition conditions selected. This may include only a portion of one sidewall, an entire sidewall as illustrated in FIG. 2I, portions of more than one sidewall (a preferred embodiment), or all of the sidewall area as illustrated in FIG. 2J, forming a complete funnel (a particularly preferred embodiment). The resulting structure after plating is illustrated in cross section in FIG. 2G. If the base is square, a perspective view of FIG. 2G could resemble the view shown in FIG. 2I.

Figure 2K:
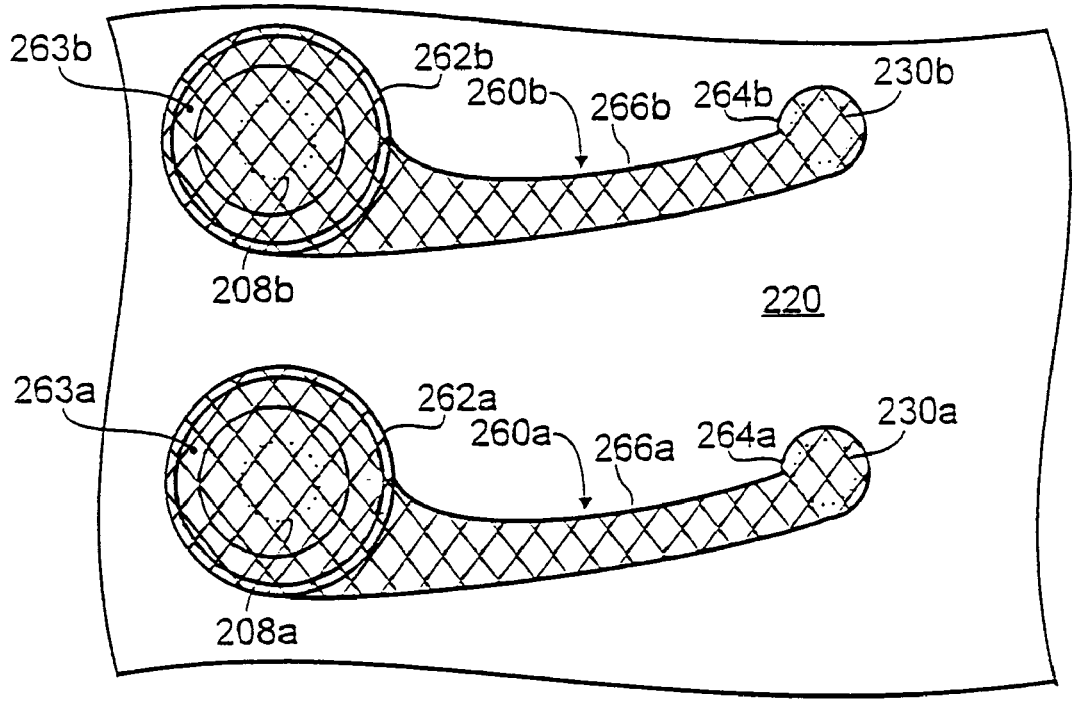
FIG. 2K is a top plan view of an interim product formed in the step shown in FIG. 2G, according to the first exemplary embodiment of a process for making a contact structure, according to the invention.
Figure 2L:
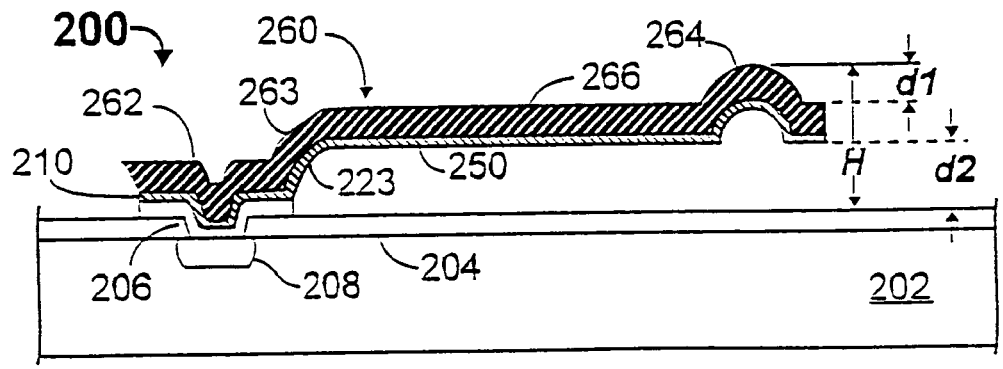
FIGS. 2L and 2M are side cross-sectional and perspective views, respectively of a completed contact structure formed on an electronic component, according to the first exemplary embodiment of a process for making a contact structure, according to the invention.

For convenience of illustration, top plan views 2F and 2K show complete funnel embodiments, alternative to the partial funnel embodiments of detailed cross sections of FIGS. 2E, 2G and 2L. One skilled in the art will recognize that FIGS. 2F and 2K can be modified slightly to correspond to the specific embodiments of FIGS. 2E, 2G and 2L. A resulting structure would resemble a partial funnel, as shown in FIG. 2I, with a circular base, as shown in FIG. 2J.

FIG. 2K is a top plan view of the electronic component 200 of FIG. 2G illustrating two of a plurality of contact structures 260*a* and 260*b*, each contact structure 260*a* and 260*b* associated with a one of two contact pads 208*a* and 208*b* (shown in dashed lines). The contact structures 260*a* and 260*b* each have a base end 262a and 262b, a tip end 264a and 264b and a central body portion 266a and 266b, respectively. The sloped regions 263a and 263b of the contact structures 260a and 260b, respectively, are illustrated in this figure.

As is evident in FIG. 2K, the resulting contact structures are suitably tapered (widthwise) from wider at their base ends 262a and 262b to narrower at their tip ends 264a and 264b, respectively, in a manner comparable to the tapered contact structures shown and described in the aforementioned PARENT CASE. The contact structures 260a and 260b are illustrated with double cross-hatching, for illustrative clarity, but it should clearly be understood that this double cross-hatching does not indicate a cross-section in this figure.

As is evident from the illustration of FIG. 2G, the base end portion 262, hence the entire contact structure 260, is electrically connected to an associated one of the contact pads 208 of the electronic component via the seed layer 250 and the conductive layer 210. As is also evident, from the description set forth hereinabove, a group of the contact pads 208 of the electronic component may be shorted to one another by the conductive layer 210 to facilitate building up the contact structures 260 by an electroplating process.

In final processing steps of the process, the masking layer 220 can be removed, such as by washing it away with a suitable solvent. For example, a masking layer 220 of photoresist can selectively be washed away with acetone, without adversely affecting any of the other elements described hereinabove. And finally, all portions of the conductive layer 210 that are not covered by another material (i.e., by the seed layer 250) can selectively be etched away using appropriate chemistry.

Figure 2M:
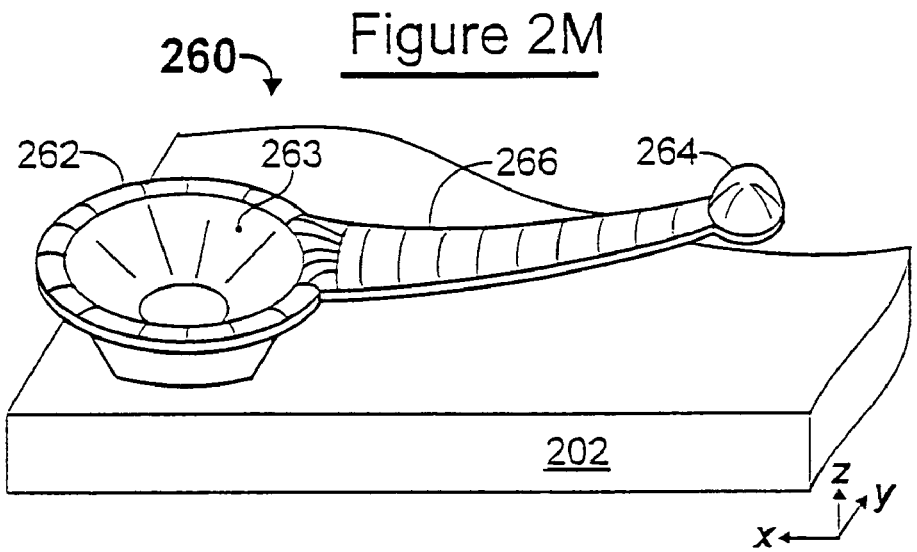

FIGS. 2L and 2M illustrate, in cross-section and perspective views, respectively, the final product of a free-standing contact structure 260 attached at its base end 262 to an electronic component, its main body portion 266 positioned away the surface of the electronic component 202, and its tip end portion 264 having a topography extending even farther from the level of the main body portion 266. The sloped region 263 of the base end 262 of the resulting contact structure 260 is clearly visible in these figures, as well as in FIGS. 2N and 2O, described hereinbelow.

In essence, for each contact structure 260, an elongate mass of conductive material is deposited onto the masking material so as to have a base end 262, a tip end 264 opposite the base end 262, and a main body portion 266 between the base end 262 and the tip end 264, wherein the main body portion 266 is in a plane which is preferably approximately parallel to the surface of the substrate 202 and which is offset (in the z-axis) from the base end 262. The tip end 264, as a result of the protruding feature 230, is further offset from the main body portion 266. When the masking material 220 is removed, the resulting contact structure 260 is free-standing, secured by its base end 262 to the substrate 202, with its tip end 264 free to make contact with a terminal (e.g., 270 or 280) of another electronic component (e.g., 272 or 282, respectively, described hereinbelow).

Materials and Processes

In a manner comparable to that of the PARENT CASE, the contact structures of the present invention are principally, preferably entirely, metallic, and may be formed (fabricated) as multilayer structures. Suitable materials for the one or more layers of the mass of conductive material for the contact structures include but are not limited to:

nickel, and its alloys;
copper, cobalt, iron, and their alloys;
gold (especially hard gold) and silver, both of which exhibit excellent current-carrying capabilities and good contact resistivity characteristics;
elements of the platinum group;
noble metals;
semi-noble metals and their alloys, particularly elements of the palladium group and their alloys; and
tungsten, molybdenum and other refractory metals and their alloys. Use of nickel and nickel alloys is particularly preferred.

In cases where a solder-like finish is desired, tin, lead, bismuth, indium and their alloys can also be used.

Suitable processes for depositing the material for the conductive layer 210, the seed layer 250, and contact structure 260 include, but are not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Suitable materials for the conductive layer 210 include titanium-tungsten (Ti—W) which may be deposited by sputtering to a thickness of 3000-6000 Å, such as to a thickness of 4500 Å. An optional but preferred addition to the conductive layer 210 is a layer of gold, which may be deposited to a thickness of 2500-4500 Å thick, for example 3500 Å thick. The purpose of the conductive layer 210 is principally to provide an electrical connection to the conductive trace(s) 250 for the purpose of utilizing an electroplating process to build up a mass of conductive material which will become the resulting contact structure (260) on the seed layer. However, it is within the scope of this invention that the conductive layer 210 is omitted. Another process such as electroless plating may be employed for building up the mass of conductive material that will become the resulting contact structure.

The seed layer 250 can be, for example, gold (Au) which may be deposited by sputtering to a thickness of about 2500-4000 Å. In another preferred embodiment, the seed layer is copper (Cu) which may be deposited by sputtering to a thickness of about 1000-3000 Å. Alternatively, the seed layer 250 may another suitable material upon which the mass of the resulting contact structure (260) can be built up.

Suitable materials for the masking material (220, 320, 420) include a variety of lithographic photoresists, Novolac resin, and polyimide.

Compliance and Resilience

Figure 2N:
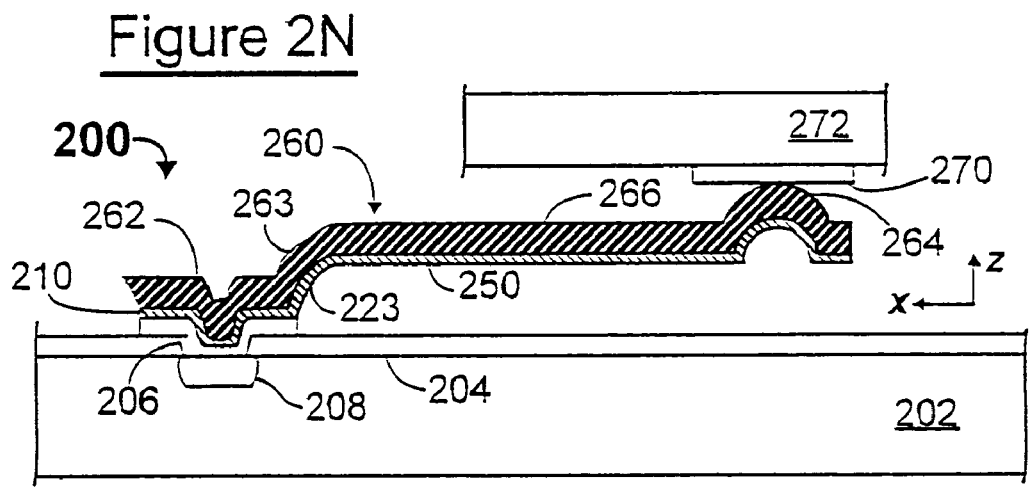
FIG. 2N is a side cross-sectional view of a contact structure of FIGS. 2L and 2M with its tip end making contact with a contact pad of an electronic component, according to the invention.

FIG. 2N illustrates a case wherein it is desired to make a pressure contact connection between a tip end 264 of a contact structure 260 and a contact pad 270 of another electronic component 272 such as a printed circuit board (PCB). In this case, the contact structure 260 should react resiliently (i.e., elastically, rather than plastically) in the "z-axis" which is normal (at ninety degrees) to the surface of the substrate 202. Such would be the case, for example, wherein it is desired to make socketable, readily removable, connections between the substrate 202 and the electronic component 272.

Figure 2O:
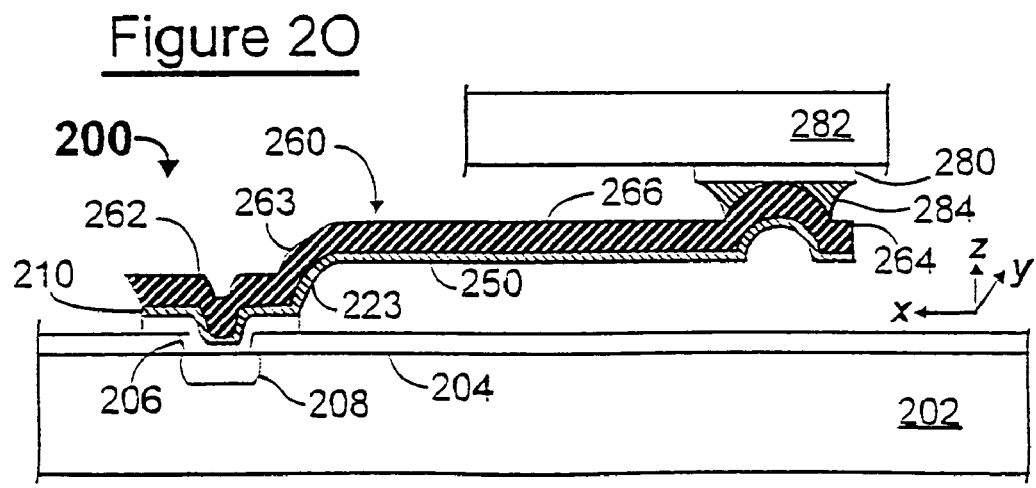
FIG. 2O is a side cross-sectional view of a contact structure of FIGS. 2L and 2M with its tip end soldered to a contact pad of an electronic component, according to the invention.

FIG. 2O illustrates a case wherein it is desired to more permanently join, such as with solder 284, the tip end 264 of contact structure 260 to a contact pad 280 (compare 270) of another electronic component 282 (compare 272) such as a printed circuit board (PCB). In this case, the contact structures 260 should react compliantly in the "x-axis" and/or "y-axis", both of which are parallel to the surface of the substrate 202. Such would be the case wherein it is desired to accommodate differences in thermal expansion coefficients between two electronic components.

It is within the scope of this invention that the contact structure (260) reacts to applied forces by resiliently and/or compliantly deflecting in any or all of the x-, y- and z-axes.

Such a resilient contact structure can be enhanced by adding additional components. Copending, commonly assigned U.S. patent application Ser. No. 08/819,464, entitled "Contact Tip Structures for Microelectronic Interconnection Elements and Methods of Making Same", and corresponding PCT application S.N. PCT/US97/08606, published Nov. 20, 1997 as WO97/43653, describes a method for defining a tip structure on a sacrificial substrate and transferring that structure to an electronic component. This tip structure can be transferred using the techniques described in that application to the structure of FIG. 2L.

Another Exemplary Contact Structure

A useful feature of the contact structure (260) of the present invention is that the tip end 264 is offset from the main body portion 266. This offset is a result of the presence of the protruding feature 230. Note the offset distance "d1" of the tip end portion 264 from the main body portion 266 of the spring contact element 260 shown in FIG. 2L. Compare FIG. 3A of the aforementioned PARENT CASE.

In certain applications, however, it is contemplated that such an offset of the tip portion from the main body portion of a contact structure would not be required.

According to an embodiment of the invention, a contact structure may have a main body portion that extends to a tip end of the contact structure without the tip end being offset from the main body portion. For example, the tip end can be generally coplanar with the main body portion. The process of fabricating such a contact structure would, proceed largely in the manner described hereinabove, with respect to FIGS. 2A-2L, with the following variations.

Figure 3A:
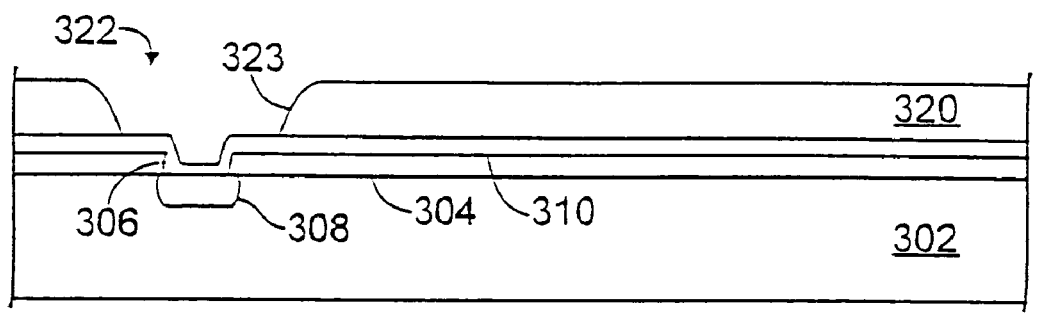
FIG. 3A is a side cross-sectional view of a step, comparable to the step shown in FIG. 2D, in a second exemplary embodiment of a portion of a process for making a contact structure, according to the invention.

FIG. 3A (compare FIG. 2D) illustrates a masking layer 320 (compare 220) having an opening 322 (compare 222) applied over a conductive layer 310 (compare 210) on a substrate (compare 202) having a contact pad 308 (compare 208) exposed through an opening 306 (compare 206) in a passivation layer 304 (compare 204). As distinguished from FIG. 2D, a protruding feature (230) is not provided. In a manner similar to that described hereinabove with respect to FIG. 2B, the tapered region of the opening 322 is designated by the reference numeral 323 in this figure.

Figure 3B:
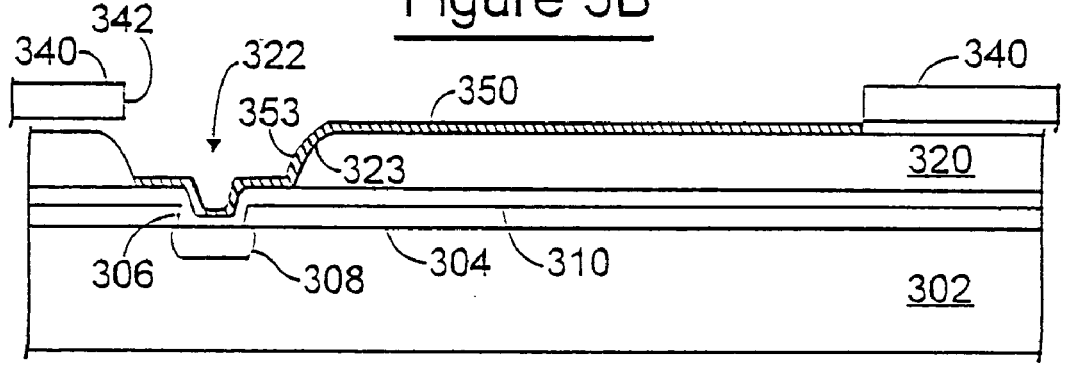
FIG. 3B is a side cross-sectional view of another step, comparable to the step shown in FIG. 2E, in the second exemplary embodiment of a portion of a process for making a contact structure, according to the invention.

FIG. 3B (compare FIG. 2E also illustrates a stencil (shadow mask) 340 (compare 240) disposed over the masking layer 320, the stencil 340 having an opening 342 (compare 242) through which a seed layer 350 (compare 250) is deposited onto the masking layer 320, including into the openings 310 and 306 and onto the contact pad 308. Since a protruding feature (230) is not provided in this embodiment, it can be observed that the seed layer 350 does not "bump up" towards what will be the tip end portion of the resulting contact structure, but rather is essentially in line (coplanar) with what will be the main body portion of the resulting contact structure. The seed layer 350 has a sloped region 353 where it is deposited on the sloped region 323 of the opening 322 in the masking material 320.

Figure 3C:
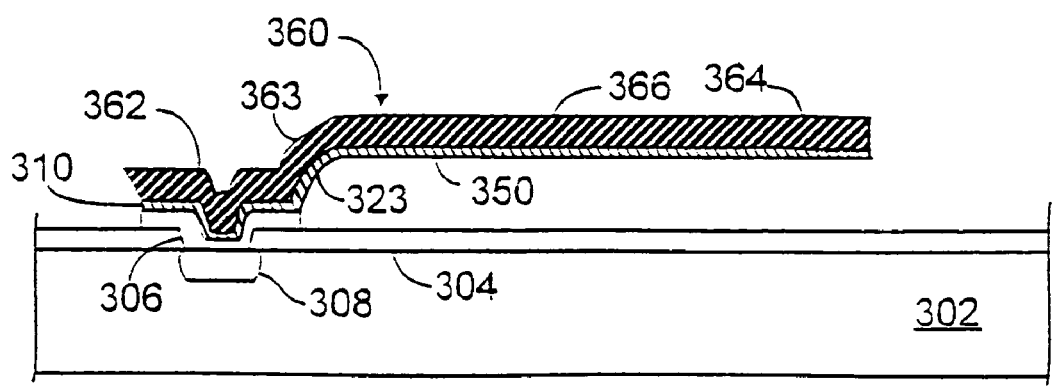
FIG. 3C is a side cross-sectional view of another step, comparable to the step shown in FIG. 2K, in the second exemplary embodiment of a portion of a process for making a contact structure, according to the invention.

Further processing steps would proceed as described with respect to the previous embodiment, including depositing the material that will form the contact structure 360, removing the masking layer 320, and removing exposed (not covered) portions of the conductive layer 310. FIG. 3C (compare FIG. 2K) illustrates the contact structure 360 (compare 260) resulting from such a process, after the aforementioned plating, washing off masking layer 320 and selectively etching away portions of the conductive layer 310 have occurred. The resulting contact structure 360 has a base end 362 (compare 262) a tip end 364 (compare 264) and a main body portion 366 (compare 266). As illustrated, the contact structure 360 has a sloped region 363 between its base end 362 and its main body portion 366. The sloped region 363 is on the sloped region 353 of the seed layer 350 which, in turn, is on the sloped region 323 of the opening 322 in the masking material 320.

This structure can be further processed by adding additional components to form a more complex structure. Copending, commonly assigned U.S. patent application Ser. No. 08/819,464, entitled "Contact Tip Structures for Microelectronic Interconnection Elements and Methods of Making Same", and corresponding PCT application S.N. PCT/US97/08606, published Nov. 20, 1997 as WO97/43653, describes a method for defining a tip structure on a sacrificial substrate and transferring that structure to an electronic component. This tip structure can be transferred using the techniques described in that application to the structure of FIG. 3C.

Figure 3D:
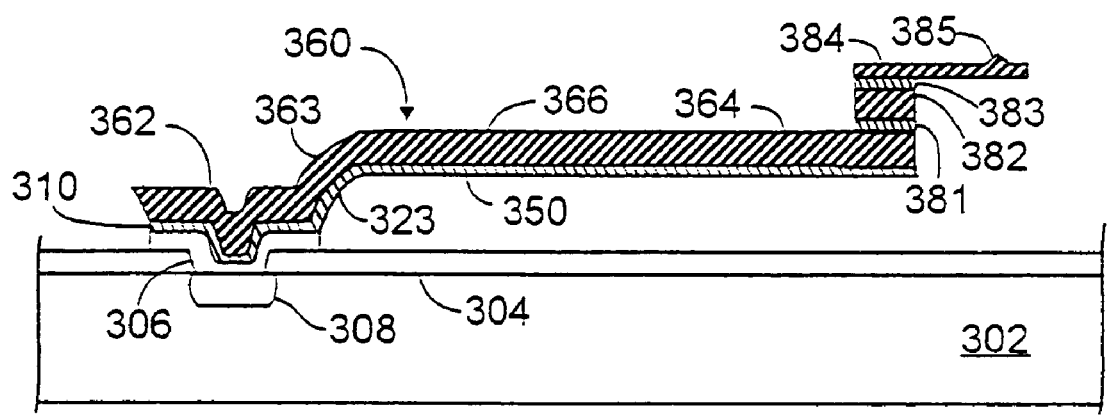
FIG. 3D is a side cross-sectional view of an optional enhanced structure, adding a tip and post structure to the structure of FIG. 3C.

Another useful enhancement to this structure is to include a spacer element so that the added tip element protrudes further away from main body portion 366. Commonly assigned U.S. patent application Ser. No. 09/023,859 filed Feb. 13, 1998 now U.S. Pat. No. 6,520,778 published Feb. 18, 2003, entitled "MICROELECTRONIC CONTACT STRUCTURES, AND METHODS OF MAKING SAME" describes making a post structure, making a tip structure, joining the two together and to a supporting structure. This would work well with the resilient contact structure of FIG. 3C, providing a resilient contact structure with a precisely defined tip structure. In one preferred embodiment, a tip-post combination prepared as described in the copending application is brazed to the tip portion of main body portion 366 and the tip-post combination is released as described in the copending application. Referring to FIG. 3D, tip portion 364 is secured by brazing material 381 to post 382, which is secured by brazing material 383 to tip body 384. Tip body 384 is illustrated with a preferred tip point 385, but this feature is optional.

Remotely Locating the Contact Structures

There has been described, hereinabove, a technique for fabricating contact structures (260) having their base ends (262) generally directly on the locations of contact pads (208) of an electronic component such as a semiconductor device. In certain applications for the electronic component, it is desirable to locate a contact structure, particularly its base end, remotely from the contact pad to which it is connected. In this manner, the tip end (264) of the contact structure (260) can have a different layout (pattern, pitch, etc.) than the contact pads to which they are connected.

The aforementioned U.S. patent application Ser. No. 08/955,001 discloses fabricating a spring contact element at an area on an electronic component which is remote from a terminal (contact pad) with which it is associated (to which it is electrically connected). Generally, the spring contact element may be mounted to a conductive line that extends from a terminal (contact pad) of the electronic component to a position remote from the terminals. In this manner, a plurality of substantially identical spring contact elements can be mounted to the electronic component so that their free (distal) ends are disposed in a pattern and at positions which are not dependent on the pattern of the terminals on the electronic component. In a particularly useful embodiment, the free ends of the spring contact terminals may be spatially translated from the terminals to which they are electrically connected.

The concept of locating spring contact elements remotely from the terminals of the electronic component can be incorporated into the technique(s) of the present invention so that the microelectronic contact structures of the present invention can be fabricated at positions remote from the terminals with which they are associated (electrically connected).

Figure 4A:
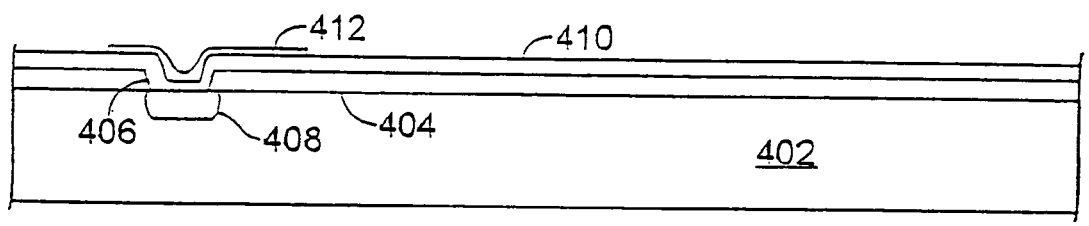
FIG. 4A is a side cross-sectional view of a step, comparable to the step shown in FIG. 2A, in a third exemplary embodiment of a process for making a contact structure, according to the invention.

FIG. 4A is comparable to FIG. 2A, and illustrates an exemplary electronic component 400 (compare 200) upon which a plurality of contact structures can be fabricated. The fabrication of a single contact structure (460, compare 260) will be described as exemplary of fabricating a plurality of such contact structures, preferably all at the same time on the same component. Typically, each of the contact structures fabricated on a single component will be substantially identical to one another (i.e., dimensions, shape, etc.), but it is within the scope of this invention that the dimensions and shape of each contact structure can individually be controlled and determined by the designer for given application requirements.

As in the previously-described example, in this example, the electronic component 400 is a semiconductor device comprising a silicon substrate 402 (compare 202), a passivation layer 404 (compare 204) disposed on the surface of the silicon substrate 402, and an opening 406 (compare 206) extending through the passivation layer 404 to a metallic contact pad 408 (compare 208).

As in the previously-described example, as shown in FIG. 4A (comparable to FIG. 2A), in a first step of the process, a conductive layer 410 (compare 210) is deposited, such as a conformal, contiguous layer of titanium-tungsten (Ti—W) deposited by sputtering to a thickness of about 4500 Å and covering the surface of the passivation layer 404, the sidewalls of the opening 406 and the exposed (within the opening) surface of the metallic contact pad 408.

In contrast to the previously-described example, in this example, a second conductive layer 412 can be deposited onto the conductive layer 410 and patterned to cover an area extending from a position on the contact pad 408 to a position 422 which is remote from the contact pad 408. Depositing and patterning the second conductive layer 412 is done with conventional semiconductor processing techniques including, but not limited to:

(a) the second conductive layer 412 is deposited as a blanket layer, and subsequently patterned (e.g. using conventional photolithographic techniques);

(b) the second conductive layer 412 is deposited as a patterned layer, using, for example, a stencil such as stencil 240 described above; or (c) the second conductive layer 412 is deposited as a blanket layer, covering all, or perhaps a region of, the conductive layer 410. This second conductive layer 412 can be patterned in a subsequent step, for example using techniques described in the aforementioned U.S. patent application Ser. No. 08/955,001.

The second conductive layer 412 preferably is a 2500-4500 Å thick, for example 3500 Å thick, layer of gold (Au). The design of and specific dimensions for second conductive layer 412 may correspond generally to a conventional trace and suitable dimensions can be selected readily by one skilled in the art.

Various techniques for providing a patterned second conductive layer 412 are discussed in the aforementioned U.S. patent application Ser. No. 08/955,001, incorporated by reference herein.

Figure 4B:
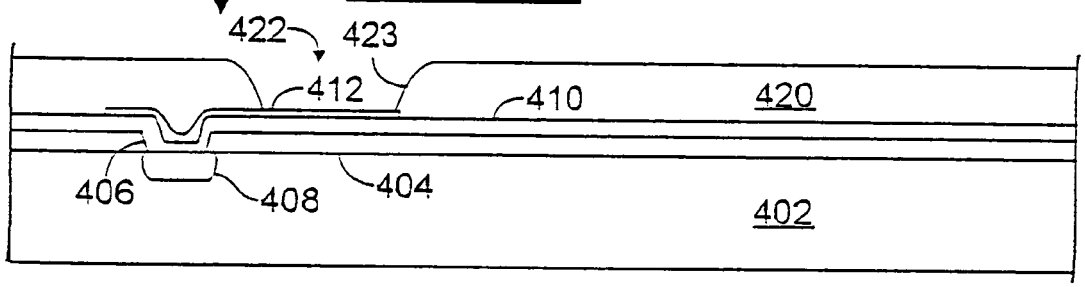
FIG. 4B is a side cross-sectional view of another step, comparable to the step shown in FIG. 2B, in the third exemplary embodiment of a process for making a contact structure, according to the invention.

As shown in FIG. 4B (comparable to FIG. 2B), in a next step of the process, a layer of masking material (e.g., photoresist) 420 is deposited onto the surface of the silicon substrate 402 (i.e., onto the conductive layer 410 and onto the second conductive layer 412) and is patterned (e.g., using conventional photolithographic techniques) to include an opening 422 (compare 222) extending completely through the masking layer 420. In this example, the opening 422 is located at a position which is remote from the opening 406 and, consequently, remote from the contact pad 408, rather than being over (as described with respect to the previous example) the opening 406 in the passivation layer 404. By locating a plurality of such openings 422 at positions which are remote from the contact pads 408, a plurality of substantially identical contact structures (460) can be fabricated on the electronic component with a layout that differs from that of the contact pads of the electronic component.

As in the previously-described example, in this example, each opening 422 preferably has a larger area than the area of opening 406 over the contact pad 408. For example, the opening 422 may have an area of 40,000 $\mu m^2$ (four times the exposed area of the contact pad 408). Again, although not a key feature of the invention, as a general proposition, the footprint (base end area) of the contact structure, should be sufficiently large (given spacing constraints) for mechanical securement (adhesion) of the contact structure to the electronic component.

As in the previously-described example, in this example the masking layer 420 is preferably deposited to a thickness of at least about 50 $\mu m$, including at least about 100 $\mu m$, at least about 150 $\mu m$, and at least about 200 $\mu m$. As in the previously-described example, in this example the sidewalls (edgewalls) of the openings 422 are preferably positively tapered. In a manner similar to that described hereinabove with respect to FIG. 2B, the tapered region of the opening 422 is designated by the reference numeral 423 in this figure.

Figure 4C:
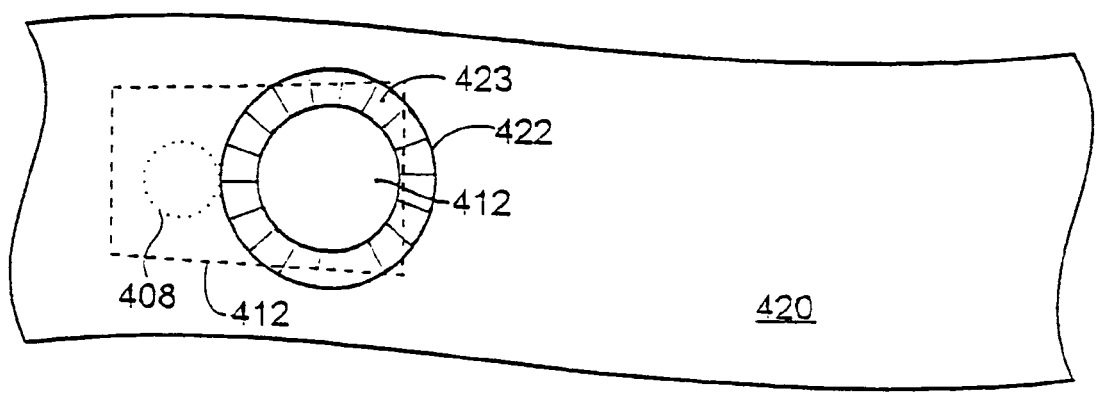
FIG. 4C is a top plan view of an interim product formed in the step shown in FIG. 4B, according to the third exemplary embodiment of a process for making a contact structure, according to the invention.

FIG. 4C (comparable to FIG. 2C) is a top plan view of the electronic component 400 of FIG. 4B, showing the opening 422 in the masking layer 420, and an associated contact pad 408 (shown in dashed lines). In this view, the patterned portion of the second conductive layer 412 is also shown in dashed lines, extending from the contact pad 408 to within the opening 422. In a manner similar to that described hereinabove with respect to FIG. 2C, the tapered region of the opening 422 is designated by the reference numeral 423 in this figure.

Figure 4D:
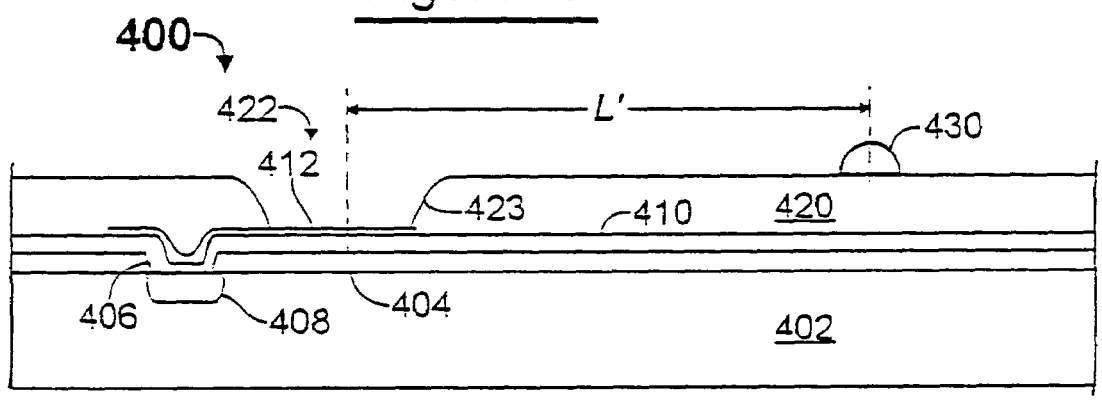
FIG. 4D is a side cross-sectional view of another step, comparable to the step shown in FIG. 2D, in the third exemplary embodiment of a process for making a contact structure, according to the invention.
Figure 4E:
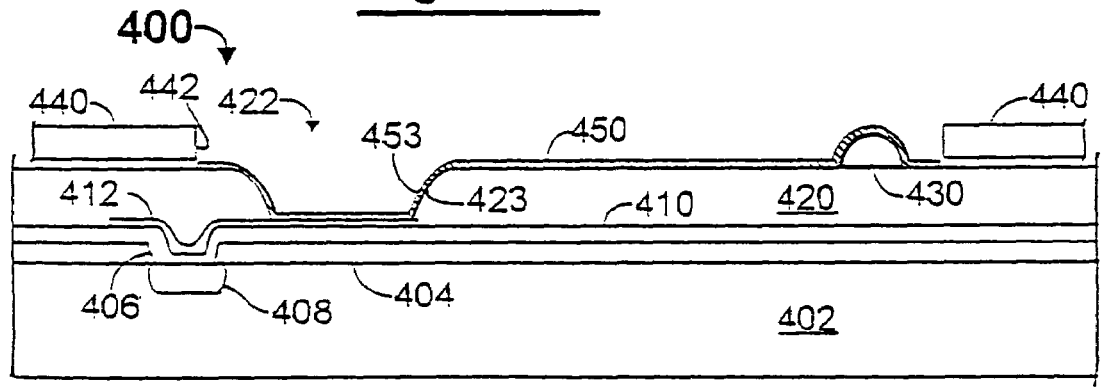
FIG. 4E is a side cross-sectional view of another step, comparable to the step shown in FIG. 2E, in the third exemplary embodiment of a process for making a contact structure, according to the invention.

In a manner comparable to that of the previously-described example, in this example, as shown in FIG. 4D (comparable to FIG. 2D), in a next step of the process, a protruding feature 430 may be deposited onto the surface of the masking layer 420 at a distance "L'" (comparable to the distance "L") from the opening 422. As in the previously described example, in this example the feature 430 defines the basic geometry of a contact (tip) end (464) of a resulting contact structure (460) being fabricated on the electronic component 400. As in the previously described example, in this illustrative example, the protruding feature 430 is a "dot" or "dollop" of material such as epoxy, photoresist, or the like.

As in the previously-described example, in this example, as shown in FIG. 4E, in a next step of the process, a stencil (shadow mask) 440 (compare 240) is disposed over the surface of the masking layer 420 and has an opening 442 (compare 242). With the stencil 440 in place on the surface of the masking layer 420, a "seed" layer 450 (e.g., of gold) is deposited (e.g., by sputtering) onto the exposed (through the openings 442) surfaces of the masking layer 420 and protruding feature 430, including extending down into the opening 422 in the masking layer 420 and onto the exposed surface of the second conductive layer 412. The patterned portion seed layer 450 can be considered a "trace" which serves as a base for defining a contact structure 460 to be fabricated on the electronic component 400. The seed layer 450 has a sloped region 453 where it is deposited on the sloped region 423 of the opening 422 in the masking material 420.

Figure 4F:
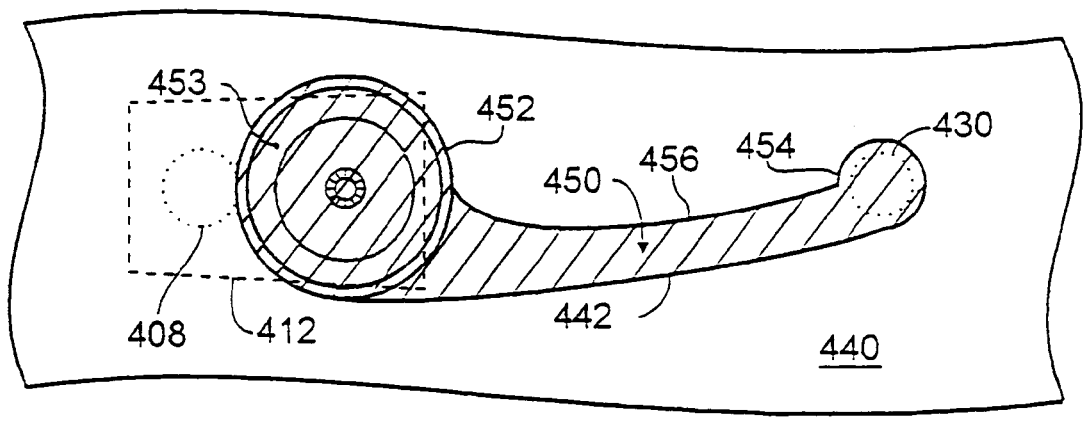
FIG. 4F is a top plan view of an interim product formed in the step shown in FIG. 4E, according to the third exemplary embodiment of a process for making a contact structure, according to the invention.
Figure 4G:
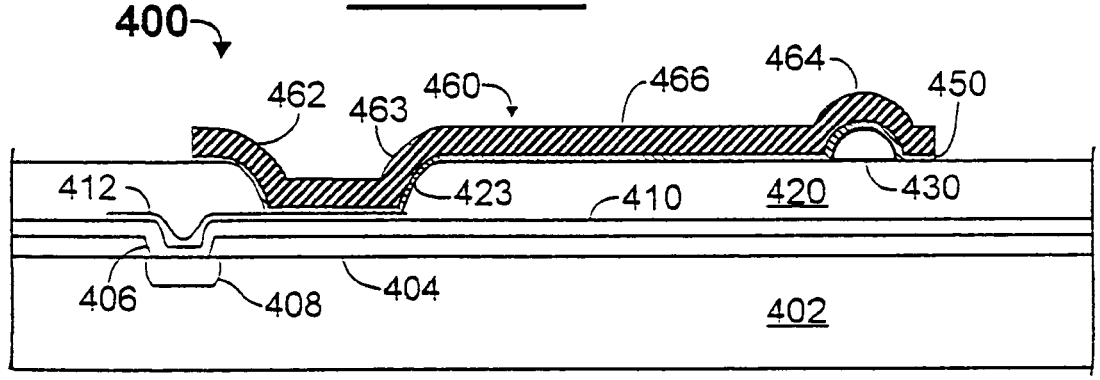
FIG. 4G is a side cross-sectional view of another step, comparable to the step shown in FIG. 2G, in the third exemplary embodiment of a process for making a contact structure, according to the invention.

FIG. 4F (comparable to FIG. 2F) is a top plan view of the electronic component 400 of FIG. 4E, showing the opening 442 in the stencil 440, the opening 442 extending from a position (the opening 422) which is remote from the contact pads 408 (shown in dashed lines) to the protruding feature 430 (shown in dashed lines).

FIG. 4F also illustrates a patterned trace of the seed layer 450 having been deposited through the opening 442 in the stencil 440. The trace is illustrated with cross-hatching, for illustrative clarity, but it should clearly be understood that this cross-hatching does not indicate a cross-section in this figure. The trace has a base end 452, a tip end 454, and a central body portion 456.

FIG. 4G (comparable to FIG. 2G) illustrates the result after a next step of the process, wherein a contact structure 460 (compare 260) is built up upon the conductive trace of seed layer 450. The contact structure 460 has a base end portion 462 (compare 262), a tip end portion 464 (compare 264) and a main body portion 466 (compare 266) extending between the base end portion 462 and the tip end portion 464. As illustrated, the contact structure 460 has a sloped region 463 between its base end 462 and its main body portion 466, the sloped region 463 built on the sloped region 453 of the seed layer 450 which, in turn, is on the sloped region 423 of the opening 422 in the masking material 420. A cross-sectional view of the contact structure 460, taken through the main body portion 466, would look comparable to the cross-sectional view of the contact structure 260 shown in FIG. 2I.

In most respects, the contact structure 460 can be identical to the contact structure 260, with the notable exception that its base end 462 is remotely located from the contact pad 408 with which it is associated. In other words, the contact structure 460 can have the same range and variety of geometries, dimensions and materials as the contact structure 260.

As in the previously-described example (compare FIG. 2K), in the final processing steps of the process in this example, the masking layer 420 can be removed, such as by washing it away with a suitable solvent, without adversely affecting any of the other elements described hereinabove. And finally, all portions of the conductive layer 210 which are not covered by another material (in this example, by the second conductive layer 412) can selectively be etched away using appropriate chemistry, resulting in a final product of a free-standing contact structure 460 attached at its base end 462 to an electronic component 400 at a location which is remote from the contact pad 408 to which it is electrically connected, its main body portion 466 being positioned away from the surface of the electronic component 400, and its tip end portion 464 having a topography positioned farther away from the level of the main body portion 466.

As in the previously-described example, the contact structure of this example can be fabricated without first disposing the dot 430 on the masking layer, resulting in a contact structure (compare 360) in which the tip end is in line with the main body portion. Again, however, the base end of such a contact structure would be remotely located from the contact pad to which it is electrically connected by the second conductive layer 412.

It is within the scope of this invention that any combination of the various contact structures (e.g., 260, 360, 460) described hereinabove can be mounted to a single electronic component.

Routing and Space Translation

With regard to the remotely located contact structures (460), various and complex routing schemes can be implemented in the manner contemplated by the aforementioned U.S. patent application Ser. No. 08/955,001.

In other words, a technique has been described for fabricating microelectronic contact structures on an electronic component that provides "space translation" from the contact pads (terminals) of the electronic component to which the contact structures are mounted. As used herein, the term "space translation" means that the tip (distal) ends of the contact structures are disposed at a different spacing (pitch) and/or orientation than the terminals of the electronic component to which they are electrically connected.

In this manner, a plurality of contact structures can be mounted to an electronic component and electrically connected to a corresponding plurality of terminals on the electronic component in a manner that the layout and/or pitch of the contact structures is different than that of the component terminals. For example, the component terminals may be disposed at a first pitch in a peripheral pattern and the tip ends of the contact structures may be disposed in an area array at a second pitch, or vice-versa.

Preferably, for a plurality of contact structures on an electronic component, each of the contact structures are fabricated to be substantially similar (such as identical) to one another. One advantage of using similar structures is that the mechanical and resilient properties of the structures can be similar. Space translation can be effected by process steps that have minimal impact on the fabrication of the contact structures.

The conductive traces of second conductive layer 412 which effect the space translation can extend in a straight line (linearly) along the surface of the electronic component to the base end of the contact structures to effect "simple" space translation such as fan-out (or fan-in). Or, the conductive traces which effect the space translation can be routed along the surface of the electronic component including, if desired, crossing over one another to effect more complex space-translation schemes.

A benefit of the present invention is that the contact layout of an existing electronic component can be modified, after the electronic component has already been completely manufactured. For example, a completed (finished) semiconductor device has a number of bond pad terminals accessible on a surface thereof through openings in a passivation layer. If a plurality of identical contact structures were mounted to or fabricated upon those terminals, the tip ends of the contact structures "mirror" the layout of the bond pads. The present invention essentially "relocates" the terminals (at least a portion thereof) so that the tip ends of the contact structures can have a completely different layout than the bond pads of the semiconductor device.

Tapering the Hole(s) in the Masking Layer

As discussed hereinabove, it is preferred that the hole (222, 322, 422) in the masking layer (220, 320, 420) be tapered. Openings that are tapered can be implemented in a number of ways.

Figure 5A:
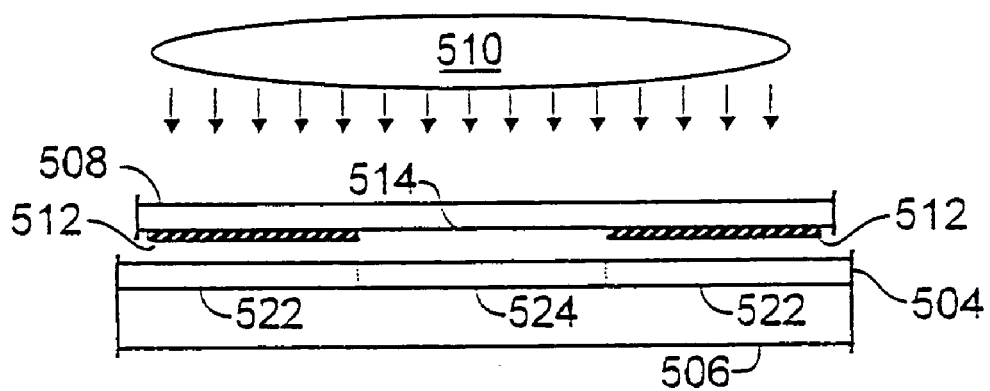
FIG. 5A is a side cross-sectional view of a technique for creating an opening in a masking layer on a substrate, according to the prior art.
Figure 5B:
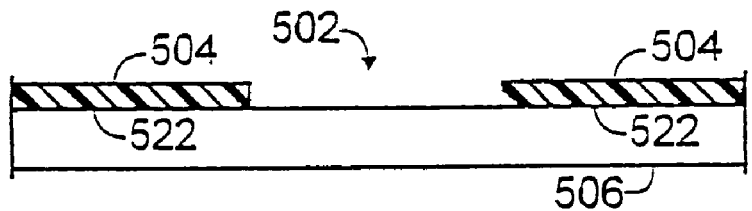
FIG. 5B is a side cross-sectional view of an opening created in a masking layer on a substrate, according to the prior art.

FIGS. 5A and 5B illustrate a prior art technique for creating an opening 502 through a layer of masking material 504 on a substrate 506. The masking layer 504 may be a photosensitive material, such as photoresist. A photolithography mask 508 is disposed over the masking layer 504. The mask 508 is transparent to (transmissive of) light from a preferably actinic light source 510. The mask 508 has a pattern of opaque material 512 (e.g., iron oxide or chrome) on a surface thereof.

Typically, the mask 508 is placed as close as possible to the masking material 504 in what may be analogized to "contact printing" in the photographic industry.

In an area 514 where there is no opaque material 512 on the surface of the mask 508, light from the source 510 can pass through the mask 508 onto the masking material 504. In the areas where there is opaque material 512 on the surface of the mask 508, light froth the source 510 cannot pass through the mask 508 onto the masking material 504. In this manner, "non-exposed" areas 522 of the masking material 504 under the opaque material 512 are shielded from light, and an "exposed" area 524 of the masking material 504 under the non-opaque area 514 of the mask 508 where there is no opaque material 512 will be exposed to light. Generally, the area 524 of the masking material 504 which is exposed to light passing through the mask 508 becomes "developed", and the areas 522 shielded from light passing through the mask 508 are not "developed". This exemplifies a "positive" photoresist, since the remaining masking material replicates the pattern of opaque material on the mask. Depending on whether the masking material 504 is "positive" or "negative", at the completion of exposure to light, either the areas 522 or the area 524 can selectively be washed away (removed) with a suitable solvent, such as acetone.

As best viewed in FIG. 5B, the developed area 524 of the masking material 504 is washed away at the completion of exposure to light.

Figure 5C:
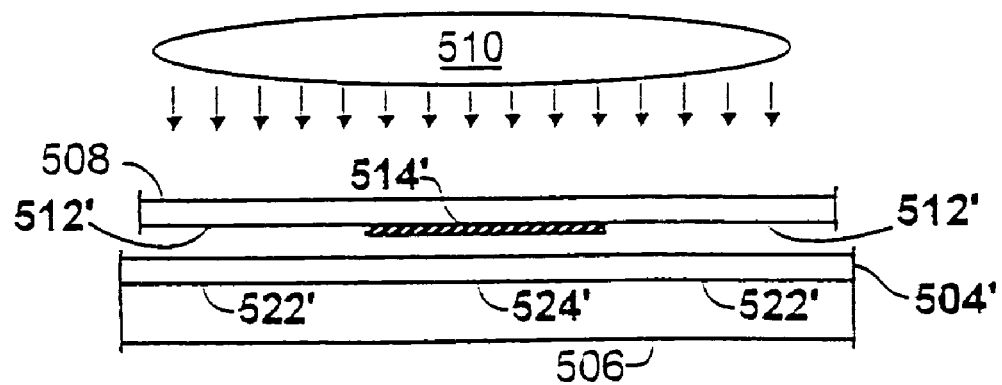
FIG. 5C is a side cross-sectional view of another technique for creating an opening in a masking layer on a substrate, according to the prior art.

FIG. 5C illustrates an alternate prior art technique for creating an opening (502) through a layer of masking material 504' (compare 504) on a substrate 506. A photolithography mask 508 is disposed over the masking layer 504, and has a pattern of opaque material 514' (compare 512) on a surface thereof. In this example, the opaque material 514' is over area 524' of the masking material 504' whereat it is desired to create the opening (502). Remaining areas 512' (compare 514) of the mask 508 are not covered by opaque material so that light from the source 510 can pass through these areas onto underlying areas 522' of the masking material 504'. In this example, the areas 522' are exposed to light and become "developed", and the area 524' is not exposed to light. The area 524' can thus be washed away at the completion of exposure to light, resulting in the desired opening (502) in the layer of masking material 504'. This exemplifies a "negative" photoresist, since the remaining masking material is the antithesis of the pattern of opaque material on the mask.

As is known, for a given masking material (including "positive" and "negative" photoresist materials) there is an optimal exposure intensity and time to ensure that certain areas (e.g., 524) of the masking material (504) become fully developed. As best viewed in FIG. 5B, such techniques can lead to very steep sidewalls in the resulting openings 502 created in the masking material 504. In most existing applications, steep sidewall openings are considered to be highly desirable.

As mentioned above, preferably, the sidewalls (edgewalls) of the openings (222, 322, 422) in the masking layer(s) of the present invention are tapered, and have a "positive" taper such as in the range of 60-75°. The possibility of using photoresist for the material of the masking layer (220, 320, 420) and, starting with an opening having a steep sidewall (see, e.g., FIG. 5B), then gently reflowing the photoresist to taper the sidewall was discussed hereinabove.

According to an aspect of the invention, tapered sidewalls in an opening in a masking material can be achieved, for example, by:

(a) gently reflowing the masking material to taper the sidewalls of openings; or (b) controlling the exposure intensity and/or time; or (c) during exposure, varying the distance of the mask from the masking layer (essentially "de-focusing" the mask during exposure); or (d) exposing the masking layer two or more times, once with a mask having a small transparent area (e.g., 514) and separately with a mask having a larger transparent area (essentially resulting in a stepped opening). A stepped masking layer may optionally be reflowed to smooth out the step(s); or (e) creating overlying openings in each of multiple masking layers, each successively larger (or smaller) than the opening in the previous masking layer, again resulting in a stepped masking layer. This may optionally be reflowed to smooth out the one or more step(s); or (f) combinations of the above (a-e).

The descriptions (a)-(e) that follow expand upon the examples (a)-(e), respectively, set forth hereinabove.

(a) Tapering by Reflowing

Figure 5D:
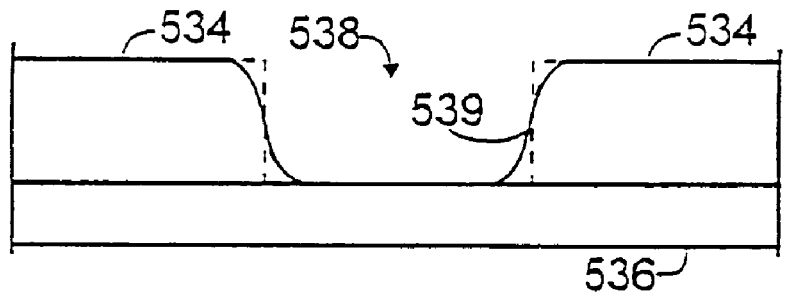
FIG. 5D is a side cross-sectional view of a technique for creating a tapered opening in a masking layer on a substrate, according to the invention.

As illustrated in FIG. 5D, commencing with a traditional opening 532 in a layer of masking material 534 on a substrate 536, the opening 532 exhibiting steep sidewalls (compare FIG. 5B), in post-finishing steps the masking material 534 can be heated in a controlled manner and/or immersed in a dilute solvent. This can "soften" the angle of the steep sidewalls of the opening, resulting in an opening 538 (compare 222, 322, 422) which curves (tapers) gently (e.g. sinusoidal, as shown) from its base (at the surface of the substrate 536) to the top (as viewed) surface of the masking material 534. It is evident, however, that the area of the base of the opening will have diminished. Therefore, the initial opening in the masking material should be oversized accordingly, so that the final "re-flowed" dimension of the base of the opening has the desired dimensions (e.g., 200 μm diameter). This figure shows that the opening 538 in the masking material 534 has a tapered region 539 (compare 223, 323, 423).

(b) Tapering by Controlling Exposure

Figure 5E:
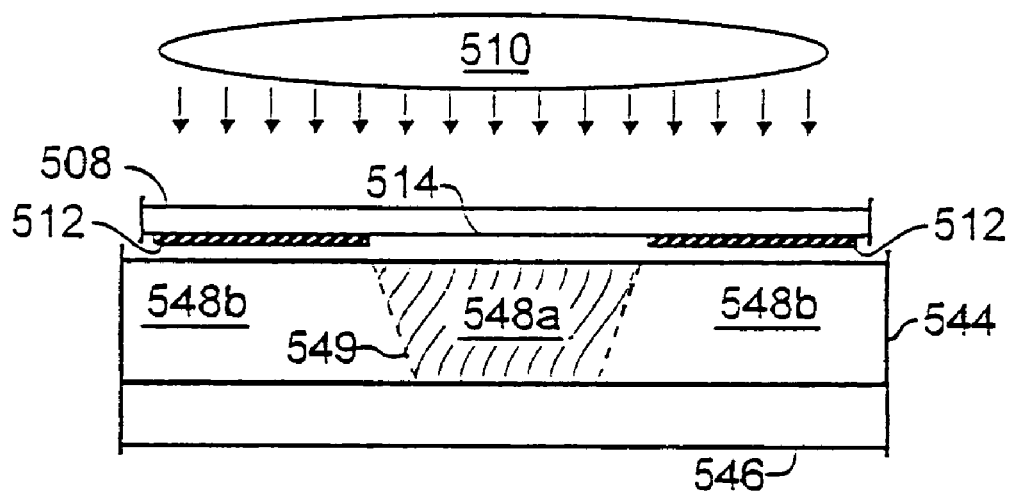
FIG. 5E is a side cross-sectional view of another technique for creating a tapered opening in a masking layer on a substrate, according to the invention.

FIG. 5E illustrates a technique for creating an opening with a tapered sidewall through a layer of masking material 544 (compare 534) on a substrate 546 (compare 536) by using the exemplary technique described with respect to FIG. 5A, and controlling the dose (exposure and duration) of light passing through the transparent area 514 of the mask 508. Generally, portions of the masking material 544 closest to its surface (top, as viewed) will develop more quickly than portions of the masking material 544 which are "deeper" in the layer. The fastest developing portion of the masking material 544 will thus be the top (as viewed) surface of the masking material 544 which is closest to the mask 508. Conversely, the slowest developing portion of the masking material 544 will thus be that portion which is immediately adjacent the substrate 546.

By limiting the exposure to a fraction, such as half, of the exposure otherwise required to fully develop the entire area of the masking material 544 immediately underneath the transparent area 514 of the mask 508, the development of the masking material 544 will be uneven from its top surface (closest to the mask) to its bottom surface (farthest from the mask, closest to the substrate).

In FIG. 5E, which represents an interim product, portions 548a of the masking material 544 which are developed are indicated by wavy-line cross-hatching and, as mentioned above, can be washed away to provide the desired opening. The opening would have the same profile as the developed portion of the masking material. Portions 548b of the masking material 544 which are not developed are indicated by no cross-hatching and, after washing away the developed portion, will define the sidewalls (shown as dashed lines) of the resulting opening. As in the previous example (a), since the sidewalls of the opening will taper from larger at the surface of the masking material to smaller at the surface of the substrate, the initial opening in the masking material should be oversized accordingly, so that the final dimension of the base of the opening has the desired dimensions (e.g., 200 µm diameter). This figure shows that that portion 548a of the masking material 544 that will become an opening has a tapered region 549 (compare 223, 323, 423).

As mentioned hereinabove (f), one or more of the tapering techniques (a-e) disclosed herein can be combined with one another to achieve the desired profile of the opening in the masking material.

(c) Tapering by Varying the Mask Distance

Another technique for creating openings in a masking layer, said openings having tapered sidewalls, is to gradually move the mask (508) away from the substrate (506) during exposure. This will de-focus the mask image on the surface of the masking material, resulting in a situation that would resemble the interim product shown in FIG. 5E. By controlling how the distance from the mask to the masking material is varied, during exposure of the masking material, the resulting opening may be larger than the transparent portion 514 of the mask 508. Therefore, the initial opening in the masking material may be undersized accordingly, so that the final dimension of the base of the opening has the desired dimensions (e.g., 200 µm diameter).

(d) Multiple Exposures

Figure 5F:
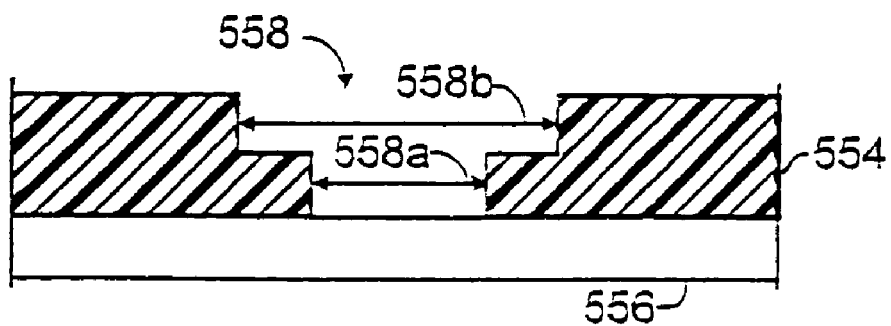
FIG. 5F is a side cross-sectional view of another technique for creating a tapered opening in a masking layer on a substrate, according to the invention.

FIG. 5F illustrates a technique for creating an opening with a tapered sidewall through a layer of masking material 554 (compare 544) on a substrate 556 (compare 546) by using the exemplary technique described with respect to FIG. 5A. In this example, a first mask is used to substantially fully develop a portion 558a of the masking material 554 in a first area having a first width dimension. A second mask is used to substantially develop only a top portion 558b (e.g., half the thickness) of the masking material 554 in a second area having a second width dimension that is larger than the first width dimension. For example, the first exposure may result in the first area having a 200 µm diameter, and the second exposure may result in the second area having a 225-250 µm diameter. Preferably, the second area is aligned over the first area so that they overlap, although they need not be concentric.

This will result in the masking material 554 having an opening 558 (compare 538) which is stepped, like an inverted wedding cake. It is within the scope of this invention that more than two masks can be used, each exposing a greater area than the previous one, to create an opening having more than one step. To remove sharp edges (if any) from the resulting opening 558, the masking material can be reflowed as in (a) above or otherwise treated to soften the slope of each sidewall. This figure shows that the opening 558 in the masking material 554 has a tapered region which, in this case, is stepped rather than smooth (compare 223, 323, 423).

(e) Tapering by Using Multiple Layers

The techniques (a-d) described hereinabove are primarily targeted at creating a tapered opening in a single layer of masking material. However, they may also be applied to each of a plurality of layers of masking material.

For example, a first layer of masking material can be exposed, then a second masking layer applied on the first masking layer and exposed. After both masking layers are exposed, the masking layers would be washed to create the openings, whether the openings are the exposed areas of the masking material or the un-exposed areas of the masking material.

For example, a final product such as is shown in FIG. 5F may be fabricated by exposing a first layer of masking material to have a first area having a 200 µm diameter, then applying a second layer of masking material, then exposing the second layer of masking material to have a second area having a 225-250 µm diameter, then washing the masking material to have an opening which is stepped in the manner described hereinabove. One or more of such multiple layers can be partially exposed, as described hereinabove with respect to FIG. 5E, so that each of the exposed areas is, in and of itself, tapered. And in a final post-processing step, the sidewall of the resulting opening in the masking material can be "smoothed", for example, by re-flowing, as described hereinabove.

Regarding creating an opening having a tapered sidewall, having a smooth (rather than stepped) sidewall is beneficial, but is not required. Also, having a constant slope, or gradual change of slope, for the sidewall of the opening is beneficial, but is not required. Multiple steps (e.g., inverted wedding cake style) can advantageously be employed, particularly if there are many, relatively thin steps. A useful average slope can be defined even with relatively steep sidewalls in each of the individual steps (tiers). The objectives are generally to provide the mechanical benefits of a structure built with a sloped component. A suitably sloped masking layer is readily coated (e.g., with seed layer 250) without mechanical or electrical discontinuities which otherwise would be a risk if the sidewall of the opening were tall and steep.

Tip Geometries

The geometry of and patterns in the seed layer (250, 350, 450) upon which the contact structure (260, 360, 460, respectively) are built up is readily controlled, as is any desired patterning of the seed layer. Base ends (262, 362, 462, respectively) of the contact structures (260, 360, 460, respectively) can be sized as large as desired. Main body portions (266, 366, 466, respectively) of the contact structures (260, 360, 460, respectively) can be curved rather than straight. Tip ends (264, 364, 464, respectively) of the contact structures (260, 360, 460, respectively) can have almost any desired shape. The tip ends (264, 364, 464) illustrated hereinabove have been shown as having a circular profile (in plan view) (see, e.g., the top plan view of FIG. 2K and the perspective view of FIG. 2M). This has been described as corresponding to a generally hemispherical topology, but readily can be a conical or spheric section, and may be truncated, according to the shape of protruding feature 230 (or 430).

As mentioned hereinabove, for example with respect to FIG. 2O, in certain applications it is desirable to solder (or braze) the tip end 264 of the contact structure to a terminal 280 of an electronic component 282 such as a printed circuit board. It is evident from this illustration that the solder 284 forms a "fillet" which smoothly "flows" between the exposed area of the pad 280 and the exposed area of the tip 264 of the contact structure 260. As a general proposition, the greater the area for which the solder can form a fillet, the stronger the resulting solder joint will be.

Therefore, according to an aspect of the invention, the geometry of the conductive trace in the seed layer (250, 350, 450) may be tailored so as to present an increased amount of surface area on the resulting tip end of the contact structure for fillet formation.

FIG. 6A illustrates, in plan view, a one of many possible shapes for the tip end 614 (compare 264) of a contact structure 610 (compare 260). In this example, the tip end 614 is formed as a ring, having a generally circular outside edge 614a, a generally circular inside edge 614b, and a gap 614c extending between the outside and inside edges 614a and 614b, respectively. In this manner, for a given thickness (not visible in this view, would be into the page), the entire outside and inside edges 614a and 614b, respectively, would provide surface area to which the solder (compare 602) could adhere and form a fillet. In topology, in one preferred form, this is in the form of a slotted disk, connected to the main body portion 616 by a sloped section 613. This sloped section is comparable to sloped region 263 (see FIG. 2G) although 613 is between the main body portion and the tip portion. The disk is generally flat, with gap 614c as shown. Such a disk is formed on a protruding feature (see 230) in the form of a truncated cone, with an opening in the stencil (see 240) to define the slotted disk as shown. In a second preferred form, the topology is a slotted hemisphere, built up on a hemispherical protruding feature, using a stencil with the appropriate openings. In a third preferred form, the tip is generally coplanar with main body portion 616.

FIG. 6B illustrates, in plan view, another one of many possible shapes for the tip end 664 (compare 614) of a contact structure 660 (compare 610). In this example, the tip end 614 is formed as a "cruciform" within an area (indicated by dashed lines) which is comparable to the area of the tip 614. This is another way of augmenting the amount of tip surface area, hence fillet-formation area, for a tip of a given size. In topology, in one preferred form, the cruciform is made from a patterned disk, comparable to that described above with regard to FIG. 6A. This includes a sloped section (not shown) comparable to sloped section 613. In another preferred embodiment, the cruciform is simply an extension of and generally coplanar with the main body portion of contact structure 660. In yet another preferred embodiment, the cruciform is formed by appropriately masking a hemispherical protruding feature (see 230).

In the top plan views of FIGS. 6A and 6B, the emphasis is on increasing the useful wettable surface area (in the z-axis or, into the page, as viewed) of the tip end 614 and 664 of the contact structure 610 and 660, respectively. The tip end has a thickness (into the sheet of the drawing, as viewed), and a side profile according to any of the embodiments of contact structures described hereinabove.

Figure 8:
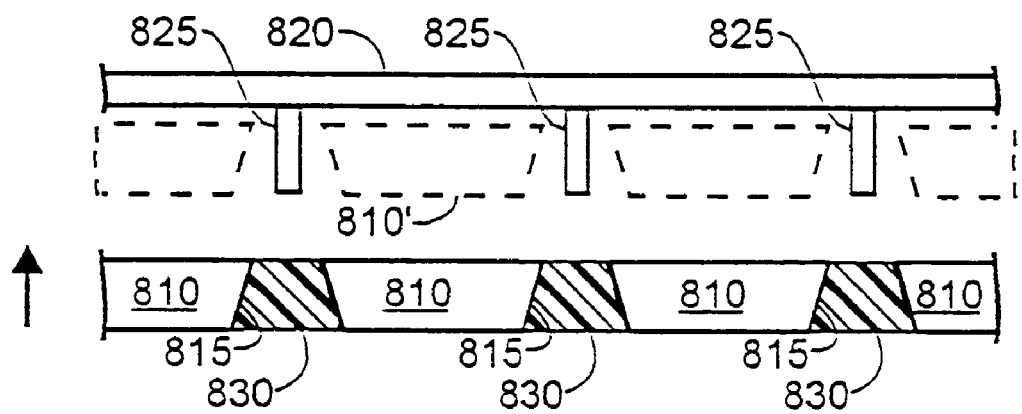
FIG. 8 illustrates a stencil for forming and transferring a protruding feature according to this invention.

As mentioned above, the protruding feature can be formed using a stencil or by screen printing. One preferred method for forming a protruding feature is to use a stencil with specifically shaped and positioned openings. Referring to FIG. 8, stencil 810 is fabricated with one or more openings 815. These openings 815 can be patterned with high precision to correspond to the desired layout of protruding features on a finished article. Each opening 815 also can be shaped to define a desired topology. In the example shown, the opening is tapered which would be useful for a truncated conic section or a truncated pyramidal section. Other shapes can be defined as desired.

The opening 815 is substantially filled with material 830 and the stencil is positioned on the masking layer (see 220 in FIG. 2D) on an electronic component (see 202). One preferred material 830 is photolithography resist material cured to have the desired mechanical and chemical properties. Materials for material 830 and for masking layer 220 can be selected so that the materials adhere such that stencil 810 can simply be lifted away from masking material 220 leaving protruding feature 230. An additional process such as heat or appropriate release conditions may be applied as needed. Another preferred release mechanism is to drive the material 830 out of opening 815 by means of a post 825 mounted on release plate 820. The stencil can be positioned against the masking layer (see 220) as before so material 830 contacts the masking material, then release plate 820 brought into position against the stencil 810, for example with post 825 just touching material 830. Moving the stencil toward release plate 820 (position 810'), post 825 will keep material 830 in contact with the masking material. By this method, protruding features in a wide variety of shapes can be applied to a masking material.

Other Variations

Various extensions of the teaching of this invention will be available to one skilled in the art, taken in combination with these teachings. For example, rather than using a stencil (240) to define the electroform traces (250), appropriate materials and laser pantography can be employed to define and create the traces.

Commonly-owned, U.S. patent application Ser. No. 08/819,464 filed 6 Mar. 97 by Eldridge, et al. (status: abandoned) and its counterpart PCT Patent Application No. US97/08606 filed 15 May 97 (status: published as WO07/43653, 20 Nov. 97, discloses techniques for fabricating contact tip structures on a sacrificial substrate, mounting the pre-fabricated contact tip structures to ends of resilient contact structures, and removing the sacrificial substrate. Such techniques could be employed, for example, with the contact structure 360 described hereinabove, to impart a topology to the tip end 362 of the contact structure.

The resulting contact structures can be heat-treated to tailor their mechanical properties, as disclosed in commonly-owned, U.S. patent application Ser. No. 08/931,923 filed 17 Sep. 97 (status: abandoned).

A contact structure(s) of nickel can be subjected to an "immersion gold" process known in the art to replace outer (exposed) portions of the nickel contact structure with gold. This will modify the ultimate contact properties of the contact structure(s) and/or alter the metallurgy for the outer portions of the nickel contact structure and may serve to protect the contact structure in a subsequent selective etching process.

CONCLUSION

Techniques are described hereinabove for fabricating microelectronic contact structures on an electronic component, wherein a contact structure is associated with (and electrically-connected to) a contact pad of the electronic component. A number of variations have been described, such as including or not including protruding features (e.g., 230, 430) for altering the topology of the tip ends of the contact structures, fabricating the contact structure (e.g., 460) at a position remote from the corresponding contact pad, and controlling the geometry of the tip end (e.g., 614) so as to facilitate robust fillet formation during soldering. The various techniques and structures disclosed herein can be "mixed and matched" with one another to create variations of the above, and various embodiments of contact structures can be disposed on any given electronic component.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other variations on the themes set forth hereinabove will occur to one having ordinary skill in the art to which the present invention most nearly pertains, and such variations are intended to be within the scope of the invention, as disclosed herein.

The invention claimed is:

1. An electronic component comprising:
   a substrate including a conductive area;
   masking material formed on said substrate, said masking material patterned to form an opening corresponding to at least a portion of said conductive area and a main body portion;
   conductive material deposited on said masking material within said opening and on said main body portion, said conductive material composing a contact structure comprising:
   a base region electrically connected to said conductive area and formed within said opening,
   a main body region formed on said main body portion of said masking material, said main body region being integrally formed with said base region and displaced away from said substrate, and
   a contact tip structure on at least a side of said main body region that faces away from said substrate, said contact tip structure configured to contact and thereby make an electrical connection with another electronic component.

2. The electronic component of claim 1, wherein the main body region comprises a curved portion.

3. The electronic component of claim 1, wherein the main body region is approximately parallel to a surface of the electronic component.

4. The electronic component of claim 1 wherein at least a portion of the main body region is displaced from the substrate by a distance of between about 5 and 200 mils (thousandths of an inch).

5. The electronic component of claim 1 wherein at least a portion of the main body region is displaced from the substrate by a distance of between about 2 and 8 mils.

6. The electronic component of claim 1, wherein said contact structure further comprises a sloped region disposed between the base region and the main body region.

7. The electronic component of claim 6 where the sloped region has an average angle of between about 60 and 75 degrees.

8. The electronic component of claim 1 wherein the conductive material comprises nickel.

9. The electronic component of claim 1 wherein the conductive material comprises a material selected from the group consisting of nickel, copper, cobalt, iron, gold, silver, elements of the platinum group, noble metals, semi-noble metals, elements of the palladium group, tungsten, and molybdenum.

10. The electronic component of claim 1 wherein the substrate comprises a semiconductor device.

11. The electronic component of claim 1 wherein the substrate comprises a semiconductor device that has been singulated from a wafer.

12. The electronic component of claim 1 wherein the substrate comprises a device selected from the group consisting of a semiconductor device, a memory device, a portion of a semiconductor wafer, a space transformer, a ceramic device, a probe card, a chip carrier and a socket.

13. The electronic component of claim 1, wherein said masking material comprises a plurality of masking layers.

14. The electronic component of claim 1, wherein said opening is tapered.

15. The electronic component of claim 1, wherein said conductive area comprises a terminal on a surface of said substrate.

16. The electronic component of claim 1 further comprising a terminal on a surface of said substrate, said terminal being electrically connected to said conductive area.

* * * * *